(12) United States Patent
Sakaguchi et al.

(10) Patent No.: US 6,833,715 B2
(45) Date of Patent: Dec. 21, 2004

(54) SEMICONDUCTOR TESTING APPARATUS AND SEMICONDUCTOR TESTING METHOD

(75) Inventors: Hideaki Sakaguchi, Tenri (JP); Masayuki Ehiro, Izumi (JP); Masami Mori, Tenri (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 10/617,387

(22) Filed: Jul. 11, 2003

(65) Prior Publication Data

US 2004/0008052 A1 Jan. 15, 2004

(30) Foreign Application Priority Data

Jul. 11, 2002 (JP) ........................................ 2002-203158

(51) Int. Cl.[7] .............................................. G01R 31/26
(52) U.S. Cl. ..................................... 324/713; 324/765
(58) Field of Search ................................ 324/713, 765, 324/759–764

(56) References Cited

U.S. PATENT DOCUMENTS 5,760,599 A * 6/1998 Ehiro .......................... 324/765
6,255,839 B1 * 7/2001 Hashimoto .................. 324/765

FOREIGN PATENT DOCUMENTS

| JP | 60-259018 | 12/1985 |
|---|---|---|
| JP | 05-312899 | 11/1993 |
| JP | 2001-099899 | 4/2001 |

* cited by examiner

*Primary Examiner*—Vincent Q. Nguyen
(74) *Attorney, Agent, or Firm*—Nixon & Vanderhye, P.C.

(57) ABSTRACT

A semiconductor testing apparatus and a semiconductor testing method are provided which permit an apparatus having an inexpensive configuration to perform, with precision, the acceptance-or-rejection determination and measurement test of a semiconductor integrated circuit having a large number of output terminals each for outputting a multi-gradation level output voltage. The semiconductor testing apparatus includes output voltage testing device and comparison voltage generation data inputting device. The output voltage testing device includes test voltage inputting device, comparison voltage generating device, a high level comparator, a low level comparator, and comparison result outputting device. The high level comparator and the low level comparator constitute comparing device for comparing a voltage to be tested, with a comparison voltage.

33 Claims, 25 Drawing Sheets

FIG. 10

(UNIT : mV)

| STEP | IVHc CORRECTION VALUE | POSITIVE TERMINAL INPUT VOLTAGE (EFFECTIVE INPUT VOLTAGE) | COMPARATOR OUTPUT | ERROR |
|---|---|---|---|---|
| 1 | 128 | 148 | HIGH | 148 |
| 2 | −64 | −44 | LOW | −44 |
| 3 | 32 | 52 | HIGH | 52 |
| 4 | −16 | 4 | HIGH | 4 |
| 5 | −40 | −20 | LOW | −20 |
| 6 | −28 | −8 | LOW | −8 |
| 7 | −22 | −2 | LOW | −2 |
| 8 | −19 | 1 | HIGH | 1 |
| 9 | −20.5 | −0.5 | LOW | −0.5 |
| 10 | −19.75 | 0.25 | HIGH | 0.25 |
| 11 | −20.125 | −0.125 | LOW | −0.125 |
| 12 | −19.9375 | 0.0625 | HIGH | 0.0625 |

(DAC QUANTIZATION ERROR : REMOVED)

FIG. 11

| STEP | IVHc CORRECTION VALUE | POSITIVE TERMINAL INPUT VOLTAGE (EFFECTIVE INPUT VOLTAGE) | COMPARATOR OUTPUT | ERROR |
|---|---|---|---|---|
| 21 | -128 | -118 | LOW | 148 |
| 22 | 64 | 74 | HIGH | -44 |
| 23 | -32 | -22 | LOW | 52 |
| 24 | 16 | 6 | HIGH | 4 |
| 25 | -8 | 2 | HIGH | -20 |
| 26 | -20 | -10 | LOW | -8 |
| 27 | -14 | -4 | LOW | -2 |
| 28 | -11 | -1 | LOW | 1 |
| 29 | -9.5 | 0.5 | HIGH | -0.5 |
| 30 | -10.25 | -0.25 | LOW | -0.25 |
| 31 | -9.875 | 0.125 | HIGH | 0.125 |
| 32 | -10.0625 | -0.0625 | LOW | -0.0675 |

(UNIT: mV)

(DAC QUANTIZATION ERROR: REMOVED)

FIG. 12

| STEP | DAC | | | | AMPLIFIER | | COMPARATOR OUTPUT VOLTAGE |
|---|---|---|---|---|---|---|---|
| | IDEAL INPUT DATA VKID | CORRECTION INPUT DATA VKHD | REAL INPUT DATA VKRD | EFFECTIVE OUTPUT VOLTAGE VKD | INPUT VOLTAGE | OUTPUT VOLTAGE | |
| 41 | 100 | 128 | 228 | 218 | -118 | -2832 | LOW |
| 42 | 100 | -64 | 36 | 26 | 74 | 1776 | HIGH |
| 43 | 100 | 32 | 132 | 122 | -22 | -528 | LOW |
| 44 | 100 | -16 | 84 | 74 | 26 | 624 | HIGH |
| 45 | 100 | 8 | 108 | 98 | 2 | 48 | HIGH |
| 46 | 100 | 20 | 120 | 110 | -10 | -240 | LOW |
| 47 | 100 | 14 | 114 | 104 | -4 | -96 | LOW |
| 48 | 100 | 11 | 111 | 101 | -1 | -24 | LOW |
| 49 | 100 | 9.5 | 109.5 | 99.5 | 0.5 | 12 | HIGH |
| 50 | 100 | 10.25 | 110.25 | 100.25 | -0.25 | -6 | LOW |
| 51 | 100 | 9.875 | 109.875 | 99.875 | 0.125 | 3 | HIGH |
| 52 | 100 | 10.0625 | 110.0625 | 100.0625 | -0.0625 | -1.5 | LOW |
| 53 | 100 | 9.9688 | 109.9688 | 99.9688 | 0.0312 | 0.7488 | HIGH |
| 54 | 100 | 10.015675 | 110.015675 | 100.015675 | -0.015675 | -0.3762 | LOW |
| 55 | 100 | 9.992237 | 109.992237 | 99.992237 | 0.00777 | 0.1865 | HIGH |

(UNIT: mV)

(OUTPUT VOLTAGE OF PRECISION VOLTAGE GENERATING MEANS13=100mV (FIXED))

FIG. 13

(UNIT : mV)

| STEP | IDEAL INPUT DATA VKID | DAC | | | AMPLIFIER | | COMPARATOR OUTPUT VOLTAGE | VKS |
|---|---|---|---|---|---|---|---|---|
| | | CORRECTION INPUT DATA VKHD | REAL INPUT DATA VKRD | EFFECTIVE OUTPUT VOLTAGE VKD | INPUT VOLTAGE | OUTPUT VOLTAGE | | |
| 61 | 100 | 128 | 228 | 228.023 | -128.023 | -3072.552 | LOW | 100 |
| 62 | 100 | -64 | 36 | 36.004 | 63.996 | 1535.904 | HIGH | 100 |
| 63 | 100 | 32 | 132 | 132.013 | -32.013 | -768.312 | LOW | 100 |
| 64 | 100 | -16 | 84 | 84.008 | 15.992 | 383.808 | HIGH | 100 |
| 65 | 100 | 8 | 108 | 108.011 | -8.011 | -192.264 | LOW | 100 |
| 66 | 100 | -4 | 96 | 96.010 | 3.990 | 95.760 | HIGH | 100 |
| 67 | 100 | 2 | 102 | 102.010 | -2.010 | -48.240 | LOW | 100 |
| 68 | 100 | -1 | 99 | 99.010 | 0.990 | 23.760 | HIGH | 100 |
| 69 | 100 | 0.5 | 100.5 | 105.510 | -0.510 | -12.240 | LOW | 100 |
| 70 | 100 | -0.25 | 99.75 | 99.760 | 0.240 | 5.760 | HIGH | 100 |
| 71 | 100 | 0.125 | 100.125 | 100.135 | -0.135 | -3.240 | LOW | 100 |
| 72 | 100 | -0.0625 | 99.9375 | 99.947 | -0.053 | 1.272 | HIGH | 100 |

(OUTPUT VOLTAGE VKS OF PRECISION VOLTAGE GENERATING MEANS 13 = 100mV (FIXED))

FIG. 14

(UNIT: mV)

| STEP | IDEAL INPUT DATA VKID | DAC CORRECTION INPUT DATA VKHD | DAC REAL INPUT DATA VKRD | DAC EFFECTIVE OUTPUT VOLTAGE VKD | AMPLIFIER INPUT VOLTAGE | AMPLIFIER OUTPUT VOLTAGE | COMPARATOR OUTPUT VOLTAGE | VKS |
|---|---|---|---|---|---|---|---|---|
| 81 | 12900 | -128 | 12772 | 12773.277 | 126.723 | 3041.352 | LOW | 12900 |
| 82 | 12900 | 64 | 12964 | 12965.296 | -65.296 | -1567.104 | HIGH | 12900 |
| 83 | 12900 | -32 | 12868 | 12869.287 | 30.723 | 737.112 | LOW | 12900 |
| 84 | 12900 | 16 | 12916 | 12917.292 | -17.292 | -415.008 | HIGH | 12900 |
| 85 | 12900 | -8 | 12892 | 12893.289 | 6.711 | 162.064 | LOW | 12900 |
| 86 | 12900 | 4 | 12904 | 12905.290 | -5.290 | -126.960 | HIGH | 12900 |
| 87 | 12900 | -2 | 12898 | 12899.290 | 0.710 | 17.040 | LOW | 12900 |
| 88 | 12900 | 1 | 12901 | 12902.290 | -2.290 | -54.960 | HIGH | 12900 |
| 89 | 12900 | -0.5 | 12899.5 | 12900.790 | -0.790 | -18.960 | HIGH | 12900 |
| 90 | 12900 | -1.25 | 12898.75 | 12900.040 | -0.040 | -0.960 | HIGH | 12900 |
| 91 | 12900 | -1.625 | 12898.375 | 12899.665 | 0.335 | 8.040 | LOW | 12900 |
| 92 | 12900 | -1.4375 | 12898.563 | 12899.852 | 0.148 | 3.552 | LOW | 12900 |

(OUTPUT VOLTAGE VKS OF PRECISION VOLTAGE GENERATING MEANS 13=12900mV (FIXED))

SEMICONDUCTOR TESTING APPARATUS AND SEMICONDUCTOR TESTING METHOD

BACKGROUND OF THE INVENTION

The present invention relates to a semiconductor testing apparatus and a semiconductor testing method and, in particular, to a semiconductor testing apparatus and a semiconductor testing method capable of testing precisely the gradation output voltages of a semiconductor integrated circuit having a large number of output terminals each for outputting a multi-level output voltage (gradation output voltage) for driving a liquid crystal display panel or the like.

Description of the Related Art

Driving schemes for liquid crystal display panels (TFT liquid crystal display panels) are classified into two types which are dot inversion scheme and line inversion scheme, depending on the polarity switching scheme of the liquid crystal driving voltage. As for the liquid crystal driving voltage which is outputted from a semiconductor integrated circuit for liquid crystal driving (liquid crystal driving apparatus, hereafter), this voltage is outputted as a DA converted voltage generated by dividing a maximum voltage of 5 V, 13 V, or the like into a predetermined multi-level voltage depending on the display gradation level. For example, in the case of 256-gradation level display, a 512-level driving voltage is outputted in dot inversion scheme, while a 256-level driving voltage is outputted in line inversion scheme.

A liquid crystal driving apparatus according to a prior art is constructed, for example, in the form of a package having 384 pins for driving the three series of R, G, and B each having 128 dots. When a liquid crystal display panel having vertical 1024 dots by horizontal 1280 dots according to SXGA standard is to be driven by any liquid crystal driving apparatus, ten of such liquid crystal driving apparatuses each constructed in the form of a package having 384 pins are to be used. Meanwhile, in the shipment of such liquid crystal driving apparatuses, total inspection is carried out, whereby those not satisfying predetermined specifications are selectively eliminated.

FIG. 17 is a block diagram schematically showing a typical liquid crystal driving apparatus. Gradation display input data RGB (6 bits or more/output in each color) is sampled sequentially, whereby the gradation display input data pieces in the number corresponding to one horizontal period are acquired and latched in a hold memory. After that, each piece of the data is provided through a level shifter to a DA converter (digital-to-analogue converter; abbreviated as a DAC in some cases, hereafter). For each output, the DAC selects a gradation level generated by a reference voltage generation circuit (ladder resistors), and thereby outputs a gradation level (gradation output voltage) through an output operational amplifier provided for each output and through an output terminal.

FIG. 18 is a circuit diagram schematically showing a reference voltage generation circuit. The above-mentioned reference voltage generation circuit generates a desired gradation level as a voltage (V0–Vn) outputted from a resistor connection point by means of the resistor-dividing of a DC voltage Vdc using ladder resistors (R1–Rn). Depending on the above-mentioned input data (the number of bits), a 6-bit DAC permits 64-gradation level display, while an 8-bit DAC permits 256-gradation level display, while a 10-bit DAC permits 1024-gradation level display. With an increase in the number of gradation levels in liquid crystal driving apparatuses, precise voltage measurement becomes indispensable in the test of liquid crystal driving apparatuses in order to ensure the quality.

That is, a test is necessary for checking whether the gradation output voltages outputted from DACs have correct voltage values and whether the values of the gradation output voltages are uniform among DACs. Further, when the supply voltage to a device to be tested (DUT: device under test) is the same, and when the performance in the output is improved from 64 gradation levels to 256 gradation levels, the precision of the measurement needs to be improved by a factor of four.

A semiconductor testing apparatus (semiconductor test system), a semiconductor testing method, and the like are described below for the case that a DUT to be tested is a liquid crystal driving apparatus (liquid crystal driving LSI) which comprises n-gradation level DACs each for selecting and outputting one from n voltage levels for driving a liquid crystal display panel and which comprises M output terminals for liquid crystal driving.

FIGS. 19 and 20 are block diagrams each showing schematically a prior art semiconductor test system. Such a prior art is disclosed, for example, in JP-A2001-99899. The prior art semiconductor test system of FIG. 19 is composed of a semiconductor testing apparatus (semiconductor tester) 182 for testing a DUT 181. The semiconductor testing apparatus 182 provides a predetermined input signal (not shown) to the DUT 181, and thereby tests (determines) whether the signals converted in a certain manner by the DACs 183 provided in the DUT 181 and then outputted from the output terminals Y1–YM are appropriate or not. In this semiconductor test system, the semiconductor testing apparatus 182 provides predetermined input signals to the DUT (liquid crystal driving apparatus) 181, and thereby causes the DUT to output sequentially the first gradation level signal through the n-th gradation level signal. This output is switched by a matrix switch 184 (ch1–chM) provided in the semiconductor testing apparatus 182, and then inputted to an analogue voltmeter 185. The analogue voltmeter 185 measures sequentially the first gradation level output voltage of each output (output terminals Y1–YM). In each time of the measurement, the result is stored in a data memory 186 provided in the semiconductor testing apparatus 182. This operation is repeated until the n-th gradation level, whereby data for all outputs and all gradation levels is eventually stored in the data memory 186. As a result, data having a size of the number of outputs m (M output terminals)×n (n gradation levels) is stored in the data memory 186.

The data stored in the data memory 186 is processed by a predetermined operation in an operation apparatus 187 provided in the semiconductor testing apparatus 182, whereby a test is performed on each gradation level output voltage of each output terminal and on the uniformity of the gradation output voltages among the output terminals. In such a test of the liquid crystal driving apparatus (DUT 181), with an increase in the number of outputs and in the number of gradation levels of the liquid crystal driving apparatus, a necessity is occurring for measuring the gradation output voltage values with higher precision. This causes an increase in the testing time, and requires an expensive semiconductor testing apparatus (182) comprising a high precision analogue voltmeter (185).

In the prior art semiconductor test system of FIG. 20, difference voltages are measured between an expected voltage (expected gradation voltage) for each gradation level and the output voltages from respective output terminals (Y1–YM) of the liquid crystal driving apparatus. Determination is performed on these difference voltages in a parallel manner by a comparing section 196. Here, the expected gradation voltage (expected voltage, in some cases hereafter) indicates a voltage expected to be generated depending on each gradation level according to the design. The prior art semiconductor test system of FIG. 20 comprises a DUT 191, a semiconductor testing apparatus 192, expected voltage generating means 60, and a differential amplifier array module 193. The DUT 191 comprises DACs 194. The differential amplifier array module 193 comprises differential amplifiers 195. The semiconductor testing apparatus 192 comprises a comparing section 196. The operation of the DUT 191 and the semiconductor testing apparatus 192 is the same as that of the DUT 181 and the semiconductor testing apparatus 182 of FIG. 19.

The expected voltage generating means 60 generates an expected gradation voltage to be outputted from the DUT 191, that is, an ideal output voltage (expected voltage). Each differential amplifier 195 in the differential amplifier array module 193 receives the output of the expected voltage generating means 60 and the output of an output terminal (Y1–YM) of the DUT 191. The differential amplifier array module 193 (differential amplifiers 195) amplifies difference voltages between the output of the expected voltage generating means 60 and the outputs of respective output terminals (Y1–YM) of the DUT 191, and then provides the difference voltages to the semiconductor testing apparatus 192 (ch1–chM).

The DUT 191 to be tested is, for example, a liquid crystal driving apparatus (liquid crystal driving LSI) which comprises M output terminals for liquid crystal driving and which comprises n-gradation level DACs 194 each for selecting one from n voltage levels and thereby outputting the voltage level through an output terminal. The semiconductor testing apparatus 192 provides an input signal (not shown) to the DUT 191, and thereby causes the DUT 191 to generate a predetermined gradation output voltage in the M output terminals. Each of the gradation output voltages from the M output terminals is simultaneously inputted to one input terminal of each differential amplifier 195 provided in the differential amplifier array module 193. On the other hand, an expected voltage for the gradation output voltage is provided from the expected voltage generating means 60 to the other input terminal of each differential amplifier 195. The differential amplifier array module 193 acquires the difference voltages of the gradation output voltages outputted from the M output terminals of the DUT 191 relative to the expected voltage outputted from the expected voltage generating means 60, that is, deviations from the expected voltage.

For the purpose of precise comparison and determination of the difference voltages, the difference voltages are first amplified by amplifying means (not shown; see amplifiers 8 in FIG. 21) provided in the differential amplifier array module 193. The M amplified voltages (Y1–YM) are outputted through the output terminals of the differential amplifier array module 193 into the tester channels (ch1–chM) of the semiconductor testing apparatus 192.

The semiconductor testing apparatus 192 comprises two pieces of voltage measuring means. These are a DC measurement unit (not shown) for measuring a DC voltage level with precision and the above-mentioned comparing section 196 provided in the tester channels. The comparing section 196 performs mainly a functional operation test, and hence has a lower precision in voltage measurement than the DC measurement unit. Thus, in an ordinary configuration, the comparing section 196 cannot perform the above-mentioned precise comparison and determination of the difference voltages. However, the above-mentioned amplification of the difference voltages using the amplifying means permits the comparing section 196 to perform the precise comparison and determination. As such, the use of the differential amplifier array module 193 in the measurement realizes a test with a similar or higher precision in comparison with the prior art.

FIG. 21 is a diagram illustrating a prior art semiconductor test system similar to that of FIG. 20. A DUT; subtractors 6 and amplifiers 8; expected voltage generating means 60; and a semiconductor testing apparatus 15 shown in FIG. 21 correspond respectively to the DUT 191, the differential amplifiers 195 (differential amplifier array module 193), the expected voltage generating means 60, and the semiconductor testing apparatus 192 of FIG. 20. A digital comparing section 11 corresponds to the comparing section 196. The semiconductor testing apparatus 15 further comprises tester controlling means 40 and a peripheral block section 12. The tester controlling means 40 performs necessary processes in response to signals (D1-DM) provided from the digital comparing section 11.

In the test performed by the apparatuses of FIGS. 20 and 21, when the expected voltage for each gradation level is outputted from the expected voltage generating means 60, an expected voltage having been set in advance according to a γ-characteristic specification or the like is calculated by a program, whereby the data obtained as the result of this calculation is transferred to the expected voltage generating means 60, and whereby expected voltages are outputted sequentially.

FIG. 22 is a block diagram showing schematically the circuit block of the expected voltage generating means in the prior art semiconductor test systems of FIGS. 20 and 21. Here, the expected voltage generating means 60 is described as the expected voltage generating means 60 in FIG. 20 and as the expected voltage generating means 60 in FIG. 21. In the expected voltage generating means 60, data transferred from the semiconductor testing apparatus 192 or the semiconductor testing apparatus 15 is inputted to controlling means 65, while data which needs to be stored temporarily is stored in storing means 66. Each piece of the data is converted into an expected voltage corresponding thereto by a DAC 61, and then outputted as an expected voltage (61a) to the differential amplifier array module 193 or the subtractor 6.

FIG. 23 is a waveform diagram showing the behavior of the gradation output voltage. This diagram shows: an expected gradation voltage waveform "a" outputted from the expected voltage generating means 60 to the differential amplifier array module 193 (differential amplifiers 195) or the subtractors 6; and a gradation output voltage waveform "b" outputted from the DUT (191) serving as a liquid crystal driving apparatus. The gradation output voltage outputted from the liquid crystal driving apparatus has deviation voltages, for example, of ΔV1, ΔV2, and ΔV3 relative to the expected voltages. In the test of the liquid crystal driving apparatus (DUT), it is tested whether these deviation voltages ΔV fall within a predetermined voltage range, and whether these deviation voltages ΔVi (i=1 through n) are uniform among the output terminals.

FIG. 24 is a block diagram showing schematically the circuit block of output voltage testing means of a prior art semiconductor testing apparatus. The output voltage testing means 50 is incorporated in the comparing section 196 of the semiconductor testing apparatus 192 of FIG. 20, and performs so-called digital determination. The output voltage testing means 50 comprises: test voltage inputting means 51 for inputting a voltage to be tested which is outputted from an output terminal (not shown) of a liquid crystal driving apparatus (DUT); a high level comparator 52 serving as high level comparing means for comparing the voltage to be tested with a high level reference voltage; a low level comparator 53 serving as low level comparing means for comparing the voltage to be tested with a low level reference voltage; VOH inputting means 54 for providing a high level comparison voltage VOH to the high level comparator 52; VOL inputting means 55 for providing a low level comparison voltage VOL to the low level comparator 53; and comparison result outputting means 56 for outputting the comparison results in the high level comparator 52 and the low level comparator 53 as high level comparison result data DMH and low level comparison result data DML, respectively. Each of the high level comparator 52 and the low level comparator 53 is composed of a comparator.

A tester controlling means 40 arranged outside the output voltage testing means 50 provides digital data of high level comparison voltage generation data IVH corresponding to the high level comparison voltage VOH, to a DAC 106. The DAC 106 converts the digital data into an analogue voltage of high level comparison voltage VOH, and then provides the high level comparison voltage VOH to the VOH inputting means 54. Similarly, the tester controlling means 40 provides digital data of the low level comparison voltage generation data IVL corresponding to the low level comparison voltage VOL, to a DAC 107. The DAC 107 converts the digital data into an analogue voltage of low level comparison voltage VOL, and then provides the low level comparison voltage VOL to the VOL inputting means 55. The tester controlling means 40 comprises plural pieces of output voltage testing means 50 in a number, for example, of 200–500 channels corresponding to the number of output terminals of the DUT (in the figure, only one channel chM is shown).

Nevertheless, according to the configuration of the prior art output voltage testing means 50 shown in FIG. 24, in the measurement of the gradation output voltage from the liquid crystal driving apparatus (DUT), the determination of the gradation output voltage is performed by digital signal processing of the comparison result output data from the comparing means (comparators) provided in the semiconductor testing apparatus. Accordingly, the precision in the voltage measurement still depends on the precision of the comparators. For the purpose of improving the precision in the measurement and determination, the comparators can be replaced by expensive ones having a higher precision (for example, 1 mV or better). Nevertheless, the semiconductor testing apparatus requires comparators in a number proportional to the number of output terminals of the liquid crystal driving apparatus (DUT). This causes the problem that the semiconductor testing apparatus itself becomes extremely expensive.

For example, in the case of a 64-gradation level (6-bit color gradation) liquid crystal driving apparatus having 384 output terminals, a voltage measurement precision of 20–10 mV or the like is sufficient in the comparators (for example, 3–5 V is divided by 64 gradation levels, while a margin of ¼ or the like of the value is assumed). In contrast, in the case of a 256-gradation level (8-bit color gradation) liquid crystal driving apparatus having 384 output terminals, a voltage measurement precision of 5.0–2.5 mV or the like is necessary in the comparators (for example, 3–5 V is divided by 256 gradation levels, while a margin of ¼ or the like of the value is assumed). This is because for the purpose of maintaining the display quality of the liquid crystal display panel, a variation among the output terminals with respect to the gradation output of the liquid crystal driving apparatus needs to be maintained within ¼ or the like of the voltage per gradation level.

That is, in the case that the supply voltage is 5 V, in a 64-gradation level liquid crystal driving apparatus, the voltage difference between adjacent gradation levels is approximately 80 mV, although this value depends on the γ-correction. Accordingly, a variation of approximately 20 mV or less needs to be guaranteed among the output terminals. Thus, the voltage measurement precision necessary in the comparators is as follows. For example, in the semiconductor test system of FIG. 20, when the difference voltage between the gradation output voltage and the expected voltage is amplified by a factor of 10 in the differential amplifier 195, a difference voltage of 20 mV (corresponding to the guaranteed variation voltage) is amplified into 200 mV. Thus, when the precision permits accurate measurement of a 20 mV which is ⅟₁₀ of the 200 mV, the guaranteed variation voltage is realized. That is, a precision permitting accurate measurement of a 20 mV which is ⅟₁₀ of the amplified voltage of 200 mV is necessary. This measurement precision agrees with the specification of the comparators of testers used widely in these days.

The DAC 61 provided in the expected voltage generating means 60 (see FIG. 22) is composed of a digital-to-analogue converter having a resolution of 2 mV or better. Nevertheless, in addition to this resolution, the DAC has an offset error of a few mV and a gain error of 0.01% or the like. Thus, there has been the problem that these errors prevent higher precision measurement of the gradation output voltage which is necessary for liquid crystal driving apparatuses with 256, 512, or greater gradation levels.

Similarly to the above-mentioned discussion, a 256-gradation level liquid crystal driving apparatus requires a measurement precision of 5 mV or the like. Further, a 512-gradation level liquid crystal driving apparatus requires a measurement precision of 2.5 mV or the like. That is, in liquid crystal driving apparatuses with gradation levels exceeding 256, the precision in the voltage measurement becomes insufficient as long as the prior art testing method is used. This has caused the problems of yield degradation and shipment quality degradation.

Further, comparators having a higher precision and a response speed of a few tens MHz are special order items, in general. Accordingly, the adoption of such new special components causes an increase in the component cost, and hence is undesirable. In order to meet demands for higher image quality in liquid crystal display panels, the number of pixels in display panels tends to increase year by year, and so does the number of output terminals per a liquid crystal driving apparatus. Accordingly, the cost of each comparator is desired to be reduced more seriously. Thus, the above-mentioned solution of adopting special comparators which causes an increase in the tester price is not desirable. The adoption of special comparators further causes the problem that such special comparators based on a special order have a difficulty in availability and hence cause a problem in emergency maintenance service.

SUMMARY OF THE INVENTION

The invention has been made with considering such a situation. An object of the invention is to provide a semiconductor testing apparatus and a semiconductor testing method which permit an apparatus having an inexpensive configuration with precision, the acceptance-or-rejection determination and measurement test of a semiconductor integrated circuit (such as a semiconductor integrated circuit for liquid crystal driving) having a large number of output terminals each for outputting a multi-gradation level output voltage.

A semiconductor testing apparatus according to the invention tests the gradation output voltage characteristics of a semiconductor integrated circuit for outputting a gradation output voltage through each of a plurality of output terminals, and comprises plural pieces of output voltage testing means each corresponding to each of said output terminals. Said output voltage testing means comprises: test voltage inputting means for inputting a voltage to be tested which is obtained from a gradation output voltage; comparison voltage generating means for generating a comparison voltage to be compared with the voltage to be tested, on the basis of comparison voltage generation data provided from comparison voltage generation data inputting means; and comparing means for comparing the voltage to be tested with the comparison voltage. Said comparison voltage generation data is generated by adding common comparison voltage generation data shared with the other pieces of the output voltage testing means to individual comparison voltage generation data provided for each piece of the output voltage testing means in order to correct an intrinsic error in each piece of the comparing means.

In a semiconductor testing apparatus according to the invention, said comparison voltage generation data inputting means comprises: common comparison voltage generation data inputting means for inputting common comparison voltage generation data; individual comparison voltage generation data inputting means for inputting individual comparison voltage generation data; and an adder for adding the common comparison voltage generation data to the individual comparison voltage generation data; wherein the result of the addition in said adder is provided as said comparison voltage generation data to the comparison voltage generating means.

In a semiconductor testing apparatus according to the invention, said comparing means comprises: a high level comparator for comparing and detecting whether the voltage to be tested is at or below an upper allowable limit relative to the comparison voltage or not; and a low level comparator for comparing and detecting whether the voltage to be tested is at or above a lower allowable limit relative to the comparison voltage or not; wherein each piece of the comparison voltage generation data inputting means and each piece of the comparison voltage generating means are provided corresponding to each of a high level comparator and a low level comparator.

A semiconductor testing apparatus according to the invention comprises correction data generating means for setting and storing said individual comparison voltage generation data and for outputting the individual comparison voltage generation data to the comparison voltage generation data inputting means. In a semiconductor testing apparatus according to the invention, each piece of said correction data generating means is provided corresponding to each piece of the output voltage testing means. A semiconductor testing apparatus according to the invention comprises: expected voltage generating means for outputting an expected gradation voltage corresponding to said gradation output voltage; and voltage difference detecting means for acquiring the difference between the gradation output voltage and the expected gradation voltage and then outputting the difference to the test voltage inputting means.

In a semiconductor testing apparatus according to the invention, said expected voltage generating means comprises: ideal value input data storing means for storing ideal value input data for the expected gradation voltage; correction value input data storing means for storing correction value input data for correcting the expected gradation voltage; an adder for adding the ideal value input data to the correction value input data and then outputting the expected voltage data; and expected voltage outputting means for generating an expected gradation voltage based on the expected voltage data and then providing the expected gradation voltage to the voltage difference detecting means.

In a semiconductor testing apparatus according to the invention, each of said comparison voltage generating means and said expected voltage outputting means comprises a digital-to-analogue converter, wherein the digital-to-analogue converter provided in the expected voltage outputting means has a higher resolution than the digital-to-analogue converter provided in the comparison voltage generating means. A semiconductor testing apparatus according to the invention comprises amplifying means for amplifying an output of said voltage difference detecting means and for providing the amplified output to the test voltage inputting means.

A semiconductor testing apparatus according to the invention comprises, in a position between said amplifying means and said test voltage inputting means, a first correction switch a common terminal of which is connected to the test voltage inputting means, a first independent terminal of which is connected to the output terminal of the amplifying means, and a second independent terminal of which is connected to a fixed potential terminal, wherein said first correction switch connects the test voltage inputting means to the amplifying means when said gradation output voltage is tested, and connects the test voltage inputting means to the fixed potential terminal when the individual comparison voltage generation data is to be set and corrected in order to correct said comparison voltage.

A semiconductor testing apparatus according to the invention comprises, in a position between said semiconductor integrated circuit and said voltage difference detecting means, a second correction switch a common terminal of which is connected to the voltage difference detecting means, a first independent terminal of which is connected to the output terminal of the semiconductor integrated circuit, and a second independent terminal of which is connected to precision voltage generating means, wherein said second correction switch connects the voltage difference detecting means to the semiconductor integrated circuit when said gradation output voltage is to be tested, and connects the voltage difference detecting means to the precision voltage generating means when said expected voltage generating means is to be corrected.

In a semiconductor testing apparatus according to the invention, said semiconductor testing apparatus is constructed as a module. In a semiconductor testing apparatus according to the invention, said semiconductor testing apparatus comprises an integrated circuit driving section for driving said semiconductor integrated circuit. In a semiconductor testing apparatus according to the invention, said semiconductor integrated circuit is composed of a semiconductor integrated circuit for liquid crystal driving.

A semiconductor testing method according to the invention is a semiconductor testing method for testing the gradation output voltage characteristics of a semiconductor integrated circuit for outputting a gradation output voltage through each output terminal, comprising the steps of providing a voltage to be tested which is based on the difference between the gradation output voltage and an expected gradation voltage corresponding to an ideal value for the gradation output voltage, into plural pieces of output voltage testing means each provided corresponding to each of the output terminals; and comparing the voltage to be tested with a comparison voltage and thereby testing the gradation output voltage by the output voltage testing means; wherein said comparison voltage is corrected in each piece of the output voltage testing means in order to correct the intrinsic error of a digital-to-analogue converter provided in each piece of the output voltage testing means.

In a semiconductor testing method according to the invention, said expected gradation voltage is corrected in order to correct the intrinsic error of a digital-to-analogue converter provided in expected voltage generating means for generating an expected gradation voltage.

The configuration according to the invention comprises: comparison voltage generating means for generating a comparison voltage (such as a reference voltage specifying an allowable range for a multi-gradation level output voltage) which is to be compared with a voltage to be tested (such as the difference voltage between the multi-gradation level output voltage and an expected gradation voltage), on the basis of comparison voltage generation data provided from comparison voltage generation data inputting means; and comparing means for comparing the voltage to be tested with the comparison voltage; wherein the comparison voltage generation data is generated by adding common comparison voltage generation data shared with the other pieces of output voltage testing means to individual comparison voltage generation data provided for each piece of output voltage testing means in order to correct an intrinsic error in each piece of comparing means. This permits individual correction of the intrinsic error in each piece of comparing means, and thereby provides a semiconductor testing apparatus and a semiconductor testing method with precision at a low cost.

According to the invention, expected voltage generating means comprises: ideal value input data storing means for storing ideal value input data for the expected gradation voltage; and correction value input data storing means for storing correction value input data for correcting the expected gradation voltage. This permits the correction of an error in the expected voltage generating means, and thereby provides a semiconductor testing apparatus and a semiconductor testing method with precision at a low cost.

The above and further objects and features of the invention will more fully be apparent from the following detailed description with accompanying drawings.

BRIEF DESCRIPTION OF THE DRAWINGS

FIG. 10 is a status table showing the status in each step of a correction method for the 0-V correction value of a high level comparator.

FIG. 11 is a status table showing the status in each step of a correction method for the 0-V correction value of a low level comparator.

FIG. 12 is a status table showing the status in each step of a correction method for the offset error of expected voltage generating means.

FIG. 13 is a status table showing the status in each step for obtaining an error correction value in the case that the output voltage of a DAC is 100 mV.

FIG. 14 is a status table showing the status in each step for obtaining an error correction value in the case that the output voltage of a DAC is 12900 mV.

DETAILED DESCRIPTION OF THE PREFERRED EMBODIMENTS

The invention is described below in detail with reference to the drawings illustrating its embodiments.

[Embodiment 1]

Figure 1:
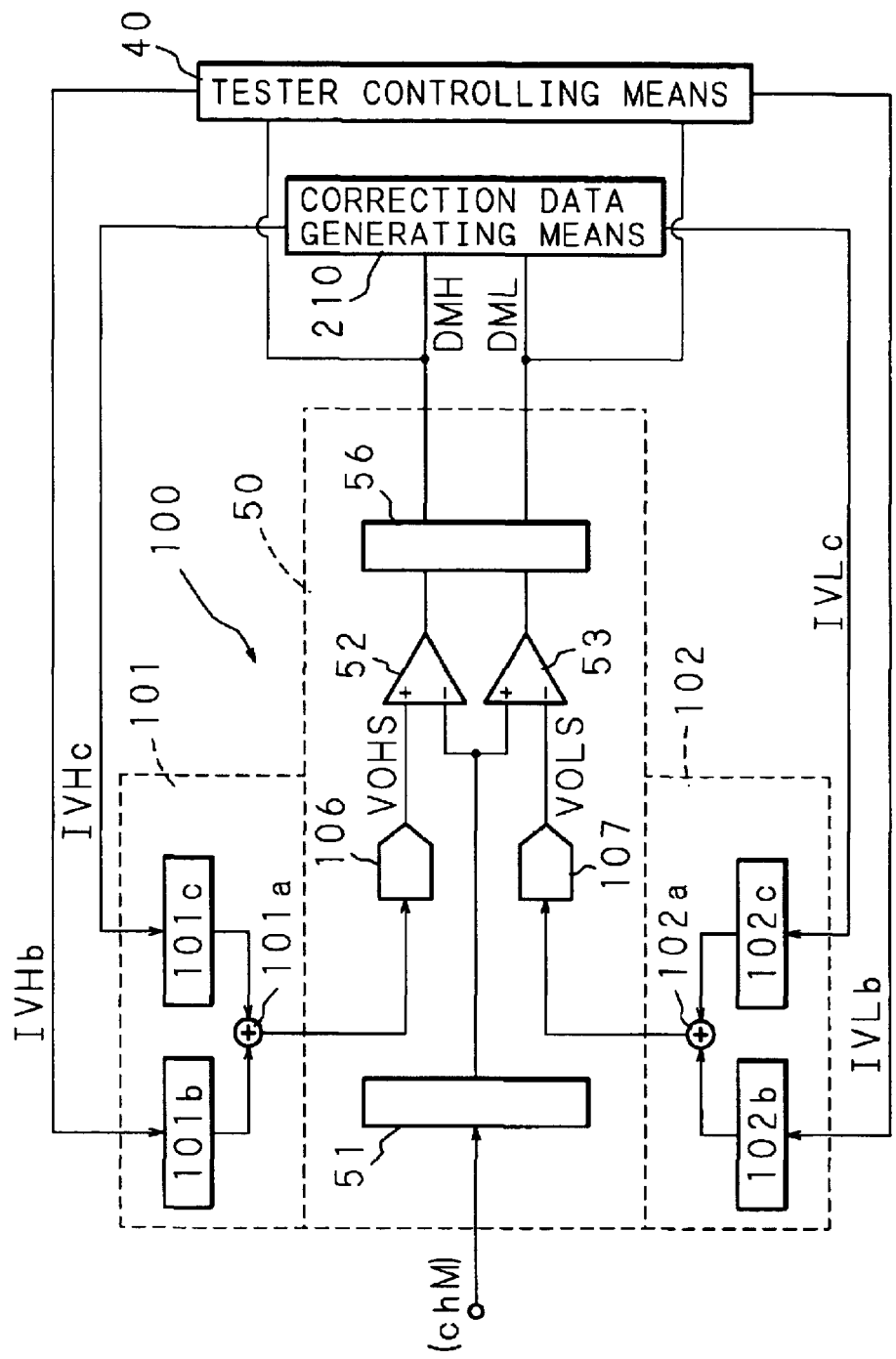
FIG. 1 is a block diagram showing the main circuit block of a semiconductor testing apparatus according to the invention.
Figure 24:
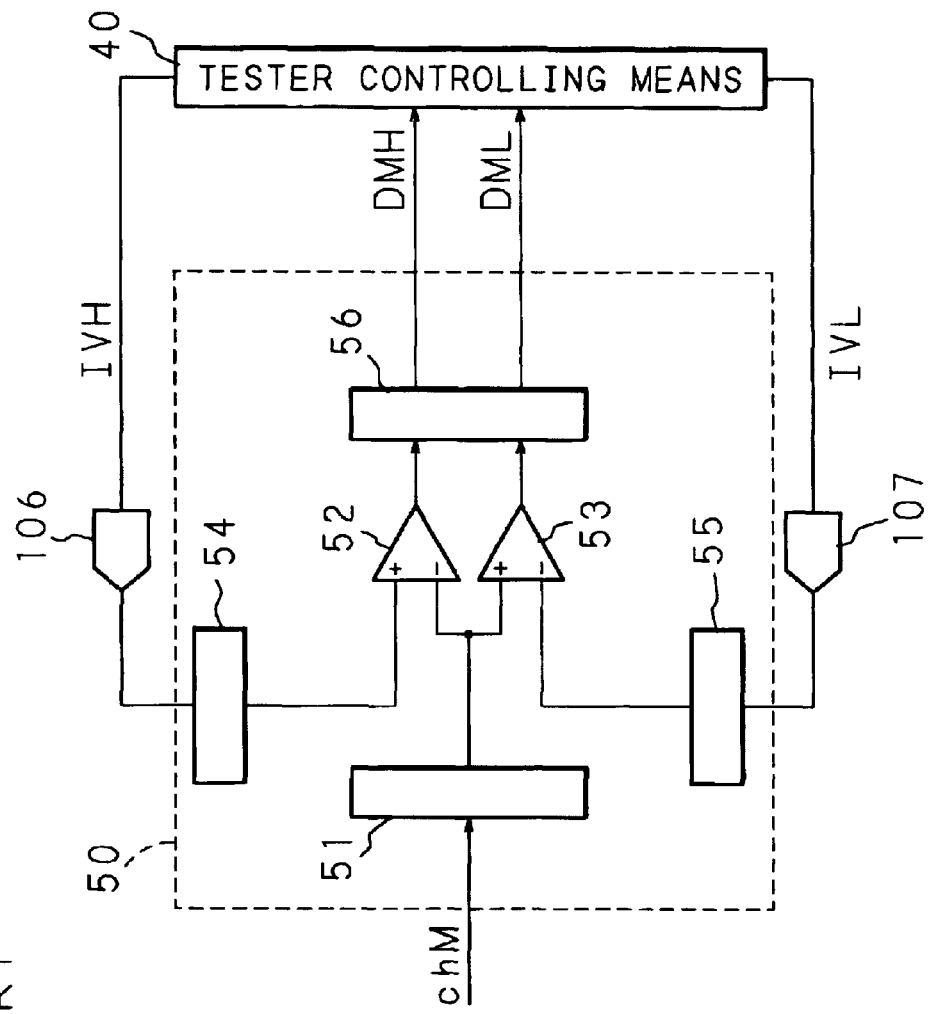
FIG. 24 is a block diagram schematically showing a circuit block of output voltage testing means in a prior art semiconductor testing apparatus.

FIG. 1 is a block diagram showing the main circuit block of a semiconductor testing apparatus according to the invention. Like blocks and the like to the prior art (see FIG. 24)

are designated by like numerals, and hence duplicated description is omitted. In the figure, numeral 100 indicates a semiconductor testing apparatus which comprises output voltage testing means 50 and comparison voltage generation data inputting means 101 and 102. The output voltage testing means 50 comprises test voltage inputting means 51, a DAC 106, a DAC 107, a high level comparator 52 (simply a comparator 52, in some cases hereafter), a low level comparator 53 (simply a comparator 53, in some cases hereafter), and comparison result outputting means 56. The output voltage testing means 50 is composed of an electronic circuit for testing a voltage to be tested. The test voltage inputting means 51 is composed of an electronic circuit for inputting a voltage to be tested. Each piece of the comparison voltage generation data inputting means 101 and 102 is composed of an electronic circuit for inputting the comparison voltage generation data. The high level comparator 52 and the low level comparator 53 constitute comparing means for comparing a voltage (test voltage) to be tested, with a comparison voltage.

Figure 20:
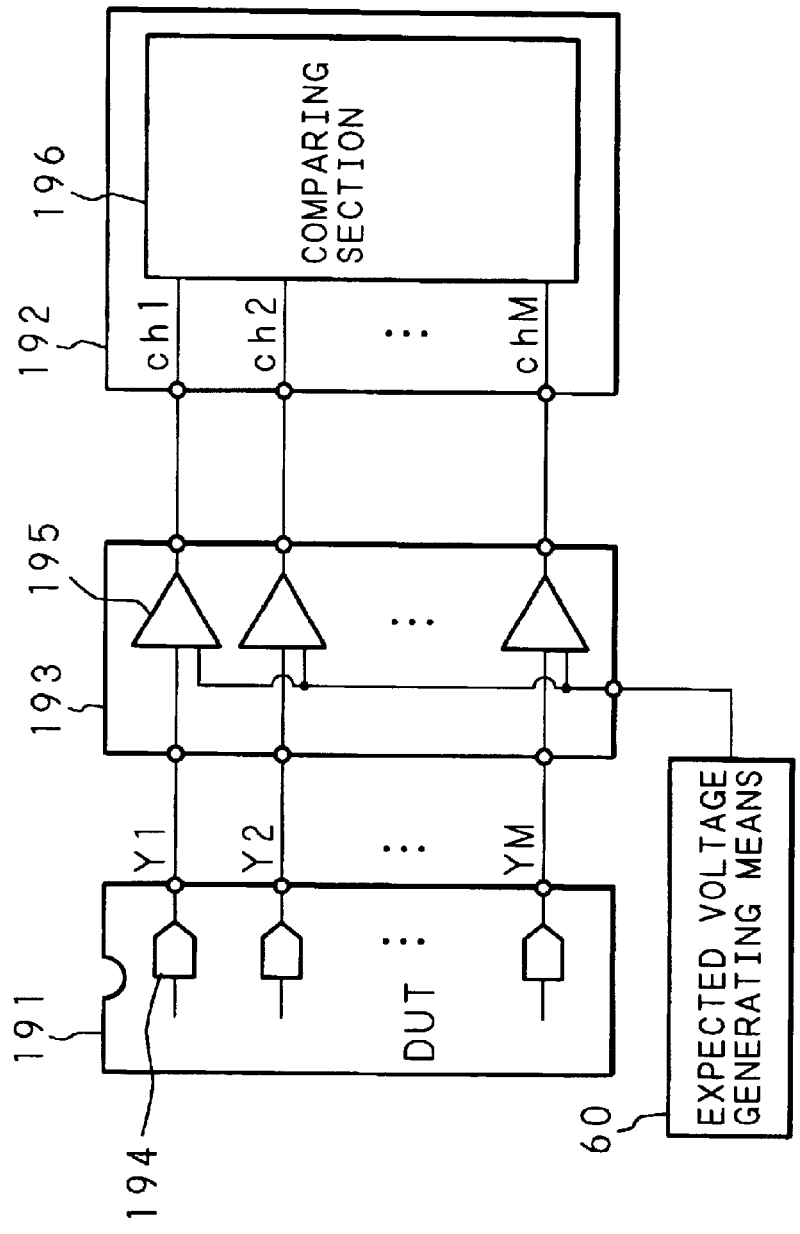
FIG. 20 is a block diagram schematically showing a prior art semiconductor test system.
Figure 21:
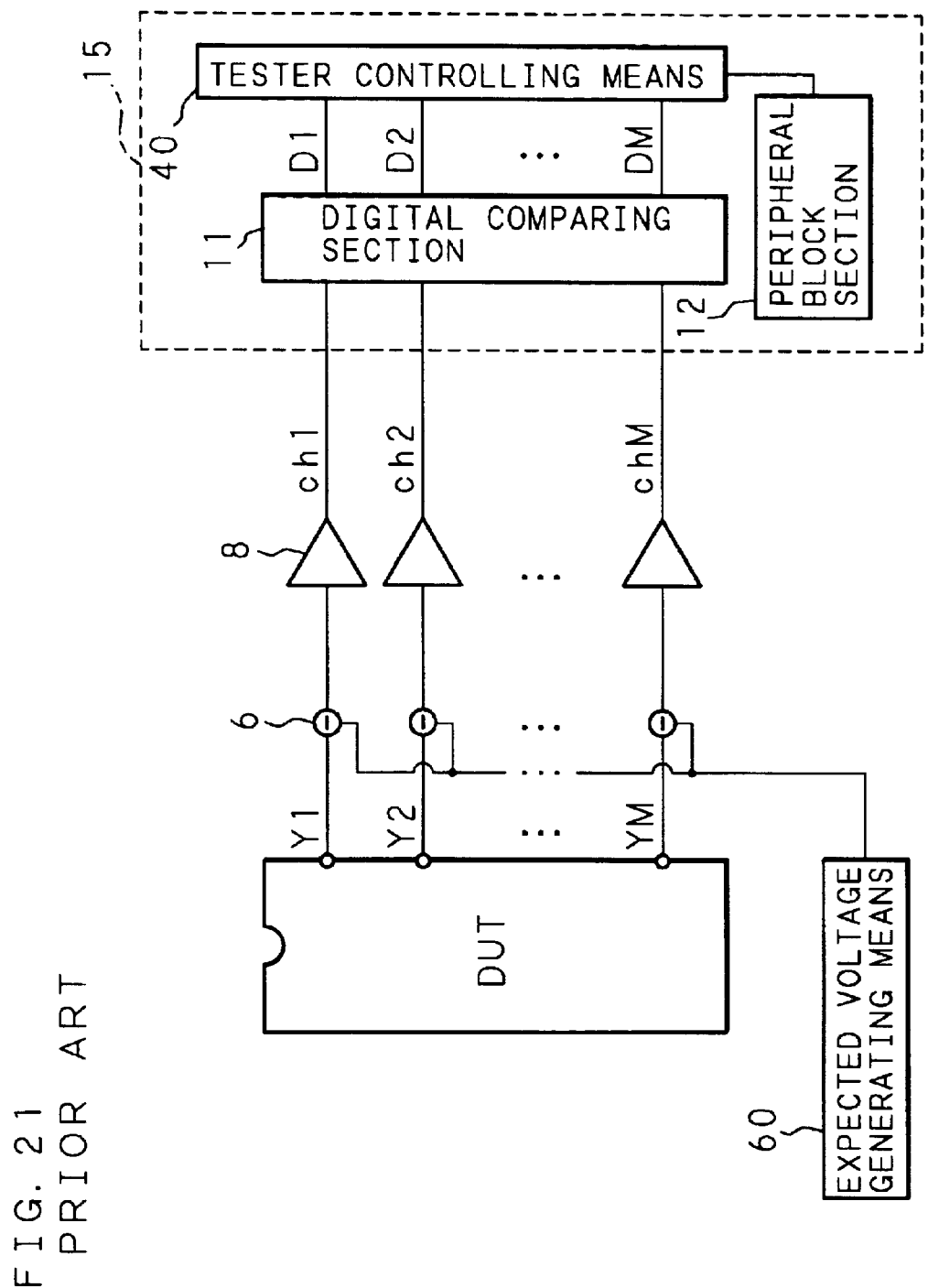
FIG. 21 is a diagram illustrating a prior art semiconductor test system similar to that shown in FIG. 20.
Figure 22:
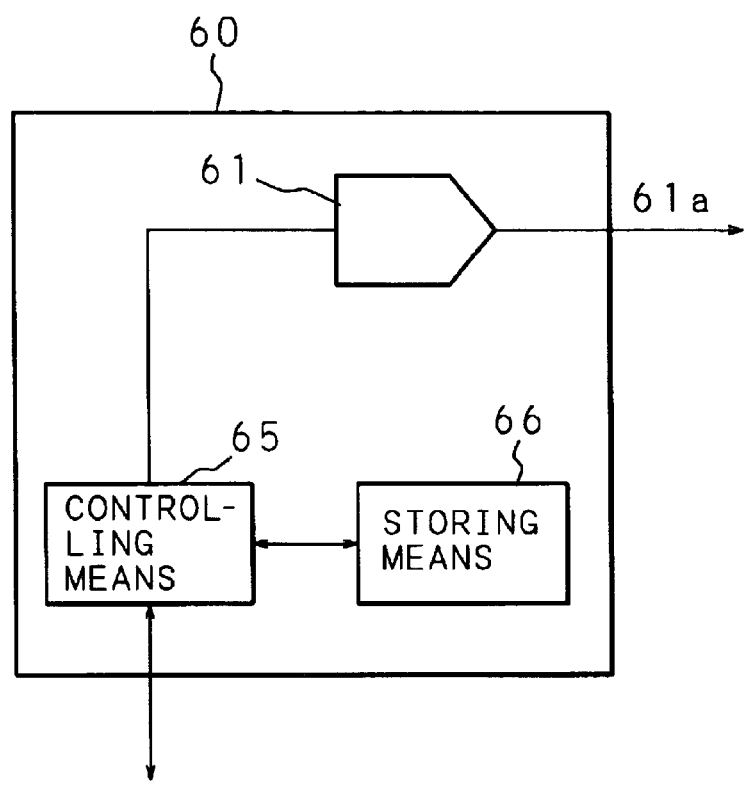
FIG. 22 is a block diagram schematically showing a circuit block of expected voltage generating means in a prior art semiconductor test system shown in FIGS. 20 and 21.
Figure 23:
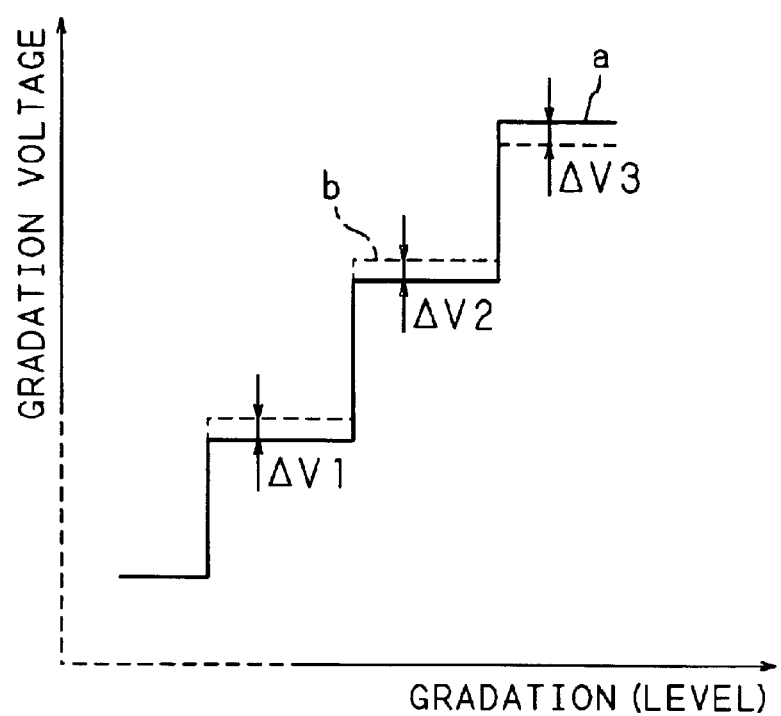
FIG. 23 is a waveform diagram showing the behavior of a gradation output voltage.

A voltage to be tested which is obtained from a gradation output voltage outputted from an output terminal of a semiconductor device (DUT, hereafter) to be tested which is not shown is provided to an input terminal (tester channel chM in this case) of the test voltage inputting means 51. As shown in FIGS. 20 and 21, the voltage to be tested is obtained as the difference voltage between the gradation output voltage and an expected voltage. The voltage to be tested is provided from the test voltage inputting means 51 to the negative input terminal of the high level comparator 52 serving as high level comparing means and to the positive input terminal of the low level comparator 53 serving as low level comparing means.

The positive input terminal of the high level comparator 52 is provided with a high level comparison voltage VOHS generated by the DAC 106 which constitutes the comparison voltage generating means, whereby the voltage to be tested which is to be compared is compared with the high level comparison voltage VOHS. The result of the comparison is provided as high level comparison result output data DMH from the comparison result outputting means 56 to correction data generating means 210. The negative input terminal of the low level comparator 53 is provided with a low level comparison voltage VOLS generated by the DAC 107 which constitutes the comparison voltage generating means, whereby the voltage to be tested which is to be compared is compared with the low level comparison voltage VOLS. The result of the comparison is provided as low level comparison result output data DML from the comparison result outputting means 56 to the correction data generating means 210. It should be noted that this configuration comprises both a high level comparator 52 and a low level comparator 53, but that even when either of the comparators is used solely, the comparator satisfies the function of the output voltage testing means 50 in the semiconductor testing apparatus 100.

The high level comparator 52 compares and detects, for example, whether the voltage to be tested is at or below an upper allowable limit relative to the comparison voltage or not. The low level comparator 53 compares and detects, for example, whether the voltage to be tested is at or above a lower allowable limit relative to the comparison voltage or not. The correction data generating means 210 is provided individually in a manner corresponding to each piece of output voltage testing means 50 or to each semiconductor testing apparatus 100. By virtue of this, for example, even when a piece of output voltage testing means 50 corresponding to any tester channel fails and thereby needs to be replaced, it is sufficient to replace merely a piece of output voltage testing means 50 and a piece of correction data generating means 210 corresponding to the tester channel. This simplifies the maintenance service of the semiconductor testing apparatus 100, and thereby reduces the maintenance cost and the wait time in the test.

In the case of high-level side comparison, input data (comparison voltage generation data) to the DAC 106 is generated in an adder 101*a* by adding high level common comparison voltage generation data IVHb inputted to common comparison voltage generation data inputting means 101*b* to high level individual comparison voltage generation data IVHc inputted to individual comparison voltage generation data inputting means 101*c*. The high level common comparison voltage generation data IVHb is provided as common data shared with the comparators (52) in the pieces of output voltage testing means (50) other than the channel chM shown in the figure, from tester controlling means 40 for controlling the semiconductor testing apparatus 100 to the common comparison voltage generation data inputting means 10*b*. The high level individual comparison voltage generation data IVHc is generated in the correction data generating means 210 as data for correcting the intrinsic error of each comparator (52), in a manner corresponding to the error of each comparator (52), and then inputted to the individual comparison voltage generation data inputting means 10*c*.

The common comparison voltage generation data inputting means 10*b*, the individual comparison voltage generation data inputting means 10*c*, and the adder 101*a* constitute high-level side comparison voltage generation data inputting means 101 corresponding to the high level comparator 52. The high level common comparison voltage generation data IVHb is data which is inputted in common to the comparators (52) in the pieces of output voltage testing means (50) other than the channel chM. In contrast, the high level individual comparison voltage generation data IVHc is inputted as an intrinsic value to each comparator (52), and thereby permits precision voltage measurement by correcting the error of each comparator (52). The common comparison voltage generation data inputting means 101*b* is composed of an electronic circuit for inputting the common comparison voltage generation data. The individual comparison voltage generation data inputting means 101*c* is composed of an electronic circuit for inputting the individual comparison voltage generation data.

The situation is similar also in low-level side comparison. Input data (comparison voltage generation data) to the DAC 107 is generated in an adder 102*a* by adding low level common comparison voltage generation data IVLb inputted to common comparison voltage generation data inputting means 102*b* to low level individual comparison voltage generation data IVLc inputted to individual comparison voltage generation data inputting means 102*c*. The low level common comparison voltage generation data IVLb is provided as common data shared with the comparators (53) in the pieces of output voltage testing means (50) other than the channel chM shown in the figure, from the tester controlling means 40 to the common comparison voltage generation data inputting means 102*b*. The low level individual comparison voltage generation data IVLc is generated in the correction data generating means 210 as data for correcting the intrinsic error of each comparator (53), in a manner corresponding to the error of each comparator (53), and then inputted to the individual comparison voltage generation data inputting means 102*c*.

The common comparison voltage generation data inputting means 102*b*, the individual comparison voltage generation data inputting means 102c, and the adder 102a constitute low-level side comparison voltage generation data inputting means 102 corresponding to the low level comparator 53. The low level common comparison voltage generation data IVLb is data which is inputted in common to the comparators (53) in the pieces of output voltage testing means (50) other than the channel chM. In contrast, the low level individual comparison voltage generation data IVLc is inputted as an intrinsic value to each comparator (53), and thereby permits precision voltage measurement by correcting the error of each comparator (53). The common comparison voltage generation data inputting means 102b is composed of an electronic circuit for inputting the common comparison voltage generation data. The individual comparison voltage generation data inputting means 102c is composed of an electronic circuit for inputting the individual comparison voltage generation data.

The individual comparison voltage generation data IVHc and IVLc serving as correction data is positive or negative depending on each case. The voltage to be tested which is to be compared may be the voltage of each output terminal of the DUT, or alternatively a voltage selected by appropriately switching a predetermined output terminal of the DUT. When the semiconductor testing apparatus 100 and the correction data generating means 210 are constructed as a single unit for each tester channel, the feedback loops for the high level individual comparison voltage generation data IVHc and the low level individual comparison voltage generation data IVLc are shortened. This reduces the influence of noise. Further, this permits maintenance service by means of unit changing in case of failure in the semiconductor testing apparatus 100 or the like, and thereby simplifies the maintenance service.

[Embodiment 2]

Figure 2:
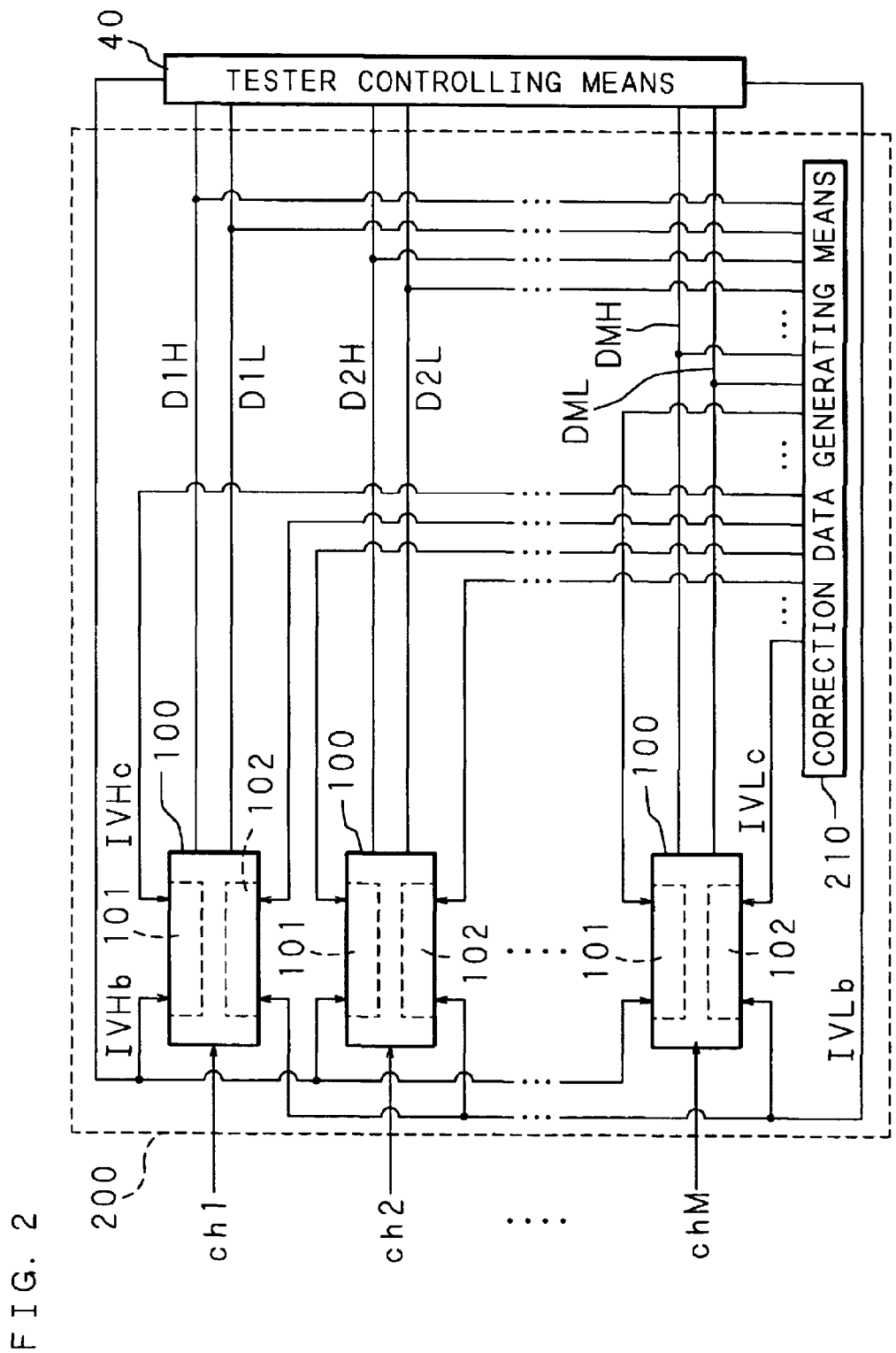
FIG. 2 is a block diagram showing a semiconductor testing apparatus comprising a plurality of the main circuit blocks for semiconductor testing apparatus of FIG. 1.

FIG. 2 is a block diagram showing a semiconductor testing apparatus comprising a plurality of the main circuit blocks for semiconductor testing apparatus of FIG. 1. The semiconductor testing apparatus 200 comprises a plurality of the semiconductor testing apparatuses 100 shown in FIG. 1, and hence duplicated description is omitted. Tester channels ch1-chM are provided as input terminals corresponding to the outputs of a DUT, while each semiconductor testing apparatus 100 is provided for each tester channel. The semiconductor testing apparatus 200 further comprises correction data generating means 210, and is connected to tester controlling means 40 in the outside. Each semiconductor testing apparatus 100 comprises comparison voltage generation data inputting means 101 and 102. The comparison voltage generation data inputting means 101 is provided with high level common comparison voltage generation data IVHb from the tester controlling means 40 and with high level individual comparison voltage generation data IVHc from the correction data generating means 210. The comparison voltage generation data inputting means 102 is provided with low level common comparison voltage generation data IVLb from the tester controlling means 40 and with low level individual comparison voltage generation data IVLc from the correction data generating means 210. It should be noted that the correction data generating means 210 is constructed as an integrated block for all tester channels in this embodiment, but that each piece of correction data generating means may be constructed as each unit for each tester channel.

Similarly to the case of FIG. 1, the intrinsic error of (the comparators (52 and 53) provided in) each semiconductor testing apparatus 100 is corrected on the basis of the high level individual comparison voltage generation data IVHc and the low level individual comparison voltage generation data IVLc. Each semiconductor testing apparatus 100 outputs high level comparison result output data D1H-DMH and low level comparison result output data D1L-DML to the correction data generating means 210 and the tester controlling means 40. The tester controlling means 40 determines the acceptance or rejection of the DUT on the basis of the comparison result output data (high level comparison result output data D1H–DMH and low level comparison result output data D1L–DML).

Figure 3:
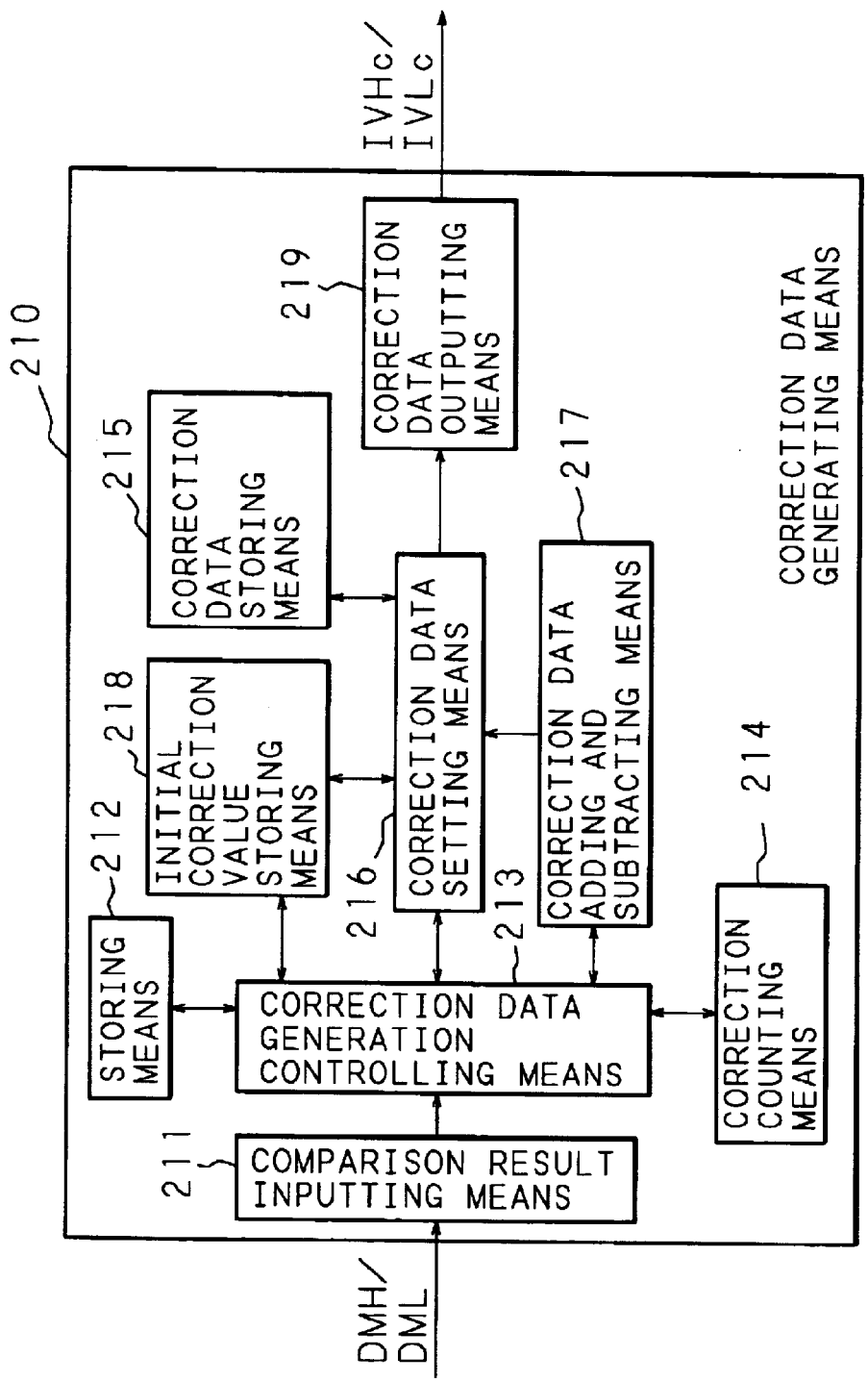
FIG. 3 is a block diagram schematically showing a block of correction data generating means.

FIG. 3 is a block diagram schematically showing a block of the correction data generating means. The correction data generating means 210 is shown as a block in FIGS. 1 and 2. Comparison result inputting means 211 is provided with the comparison result output data (high level comparison result output data D1H–DMH and low level comparison result output data D1L–DML) which is the result of comparison between the voltage to be tested and the comparison voltage obtained in the semiconductor testing apparatus (100 or 200). This figure shows the situation (DMH/DML) of the tester channel M (chM). The correction data (individual comparison voltage generation data IVHc) for correcting the intrinsic error of the high level comparator 52 is generated on the basis of the high level comparison result output data DMH (D1H-DMH). The correction data (individual comparison voltage generation data IVLc) for correcting the intrinsic error of the low level comparator 53 is generated on the basis of the low level comparison result output data DML (D1L-DML).

The following description is made for the case of the generation of the correction data (individual comparison voltage generation data IVHc; referred to simply as correction data IVHc, hereafter) for the high level comparator 52. However, the situation is similar also in the generation of the correction data (individual comparison voltage generation data IVLc) for the low level comparator 53. The data (high level comparison result output data DMH) inputted to the comparison result inputting means (electronic circuit for inputting the result of comparison) 211 is received by correction data generation controlling means (electronic circuit for controlling the generation of the correction data) 213. The correction data generation controlling means 213 controls the entirety of the correction data generating means 210. Storing means (memory device) 212 stores a program for control operation and temporarily stored data such as calculation results. The correction data IVHc to be outputted to the high level comparator 52 is set in correction data setting means (electronic circuit for setting the correction data) 216. Both in and after the generation of the correction data IVHc, the correction data IVHc is outputted through correction data outputting means (electronic circuit for outputting the correction data) 219, the comparison voltage generation data inputting means 101, and the like to the high level comparator 52, on the basis of the data having been set in the correction data setting means 216.

The optimum correction data detected is stored in correction data storing means (correction data memory device) 215. In the subsequent procedure, the optimum correction data stored in the correction data storing means 215 is set into the correction data setting means 216. Accordingly, the correction data storing means 215 is preferably composed of a non-volatile memory capable of maintaining the stored optimum correction data even in the case that the semiconductor testing apparatus (100 or 200) is powered off. The correction data generation controlling means 213 is further connected to correction counting means 214 for maintaining the number of correction operations to be appropriate. The correction data generation controlling means 213 and the correction data setting means 216 are further connected to correction data adding and subtracting means (electronic circuit for adding and subtracting the correction data) 217 and initial correction value storing means (initial correction value memory device) 218. The method of correction is described later (see Embodiment 7 and the like). Obviously, the correction data generation controlling means 213 may be implemented in the form of a computer comprising a CPU (central processing unit) and the like, whereby the operation may be realized by a software process. The correction data generating means 210 is composed of an electronic circuit for generating the correction data (the individual comparison voltage generation data).

[Embodiment 3]

Figure 4:
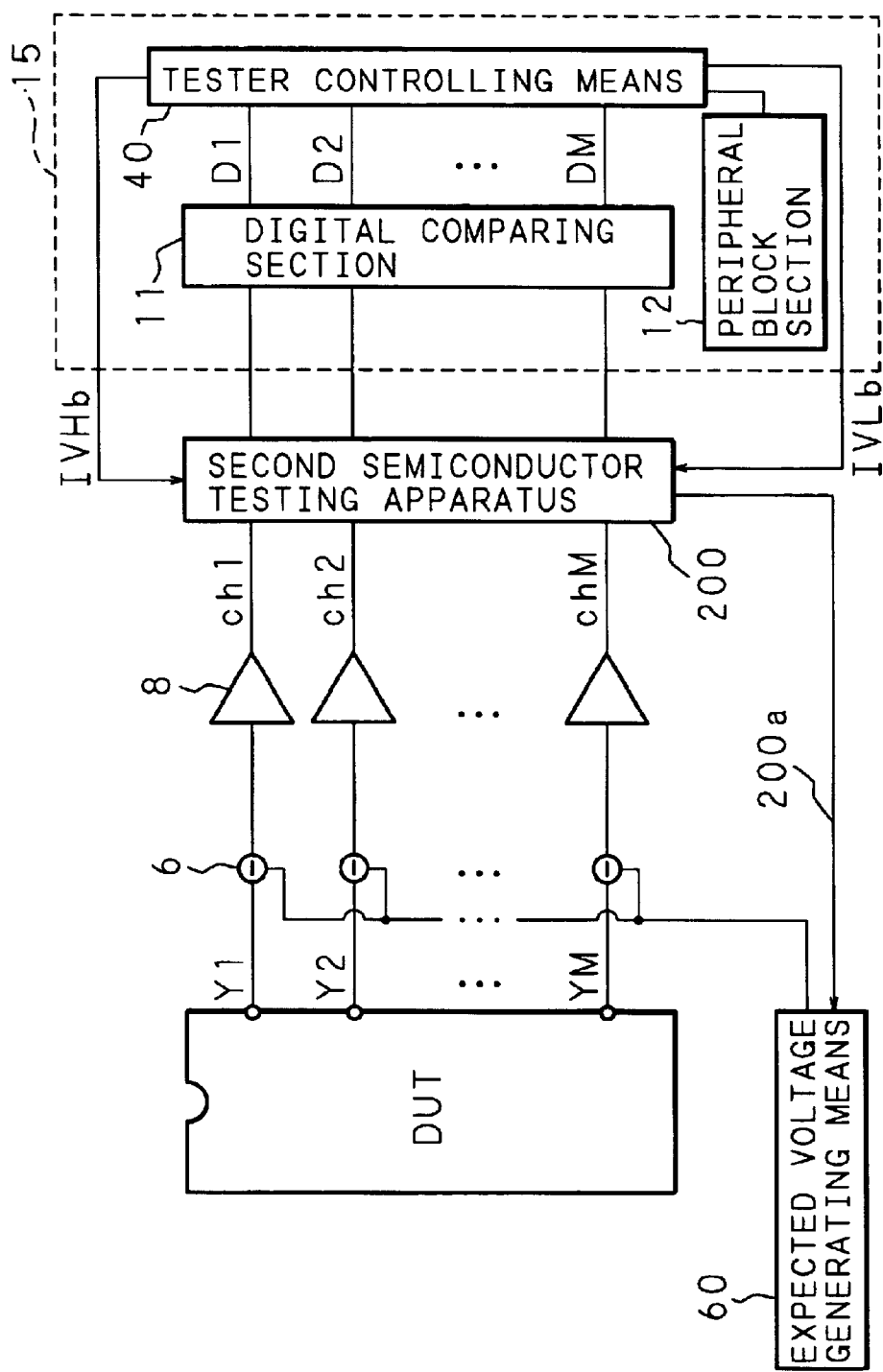
FIG. 4 is a block diagram schematically showing a block of a semiconductor testing apparatus according to the invention.

FIG. 4 is a block diagram schematically showing a block of a semiconductor testing apparatus according to the invention. A second semiconductor testing apparatus 200 (this corresponds to the semiconductor testing apparatus 100 of FIG. 1 and the semiconductor testing apparatus 200 of FIG. 2; the specification "second" is for the purpose of discrimination from a first semiconductor testing apparatus 201 (see FIG. 5) described later) is constructed, for example, in the form of a module, and thereby arranged in the outside and on the input side of the prior art semiconductor testing apparatus (semiconductor tester) 15. This permits the intact use of the prior art semiconductor testing apparatus 15 without modification, and still improves the precision in the test of semiconductor integrated circuits. Further, when the semiconductor testing apparatus (100, 200, and 201) comprises an integrated circuit driving section (not shown) for driving a DUT composed of a semiconductor integrated circuit, the semiconductor testing apparatus (semiconductor test system) can perform the test more efficiently.

On the input side of the second semiconductor testing apparatus 200, the semiconductor testing apparatus further comprises subtractors 6, amplifiers 8, and expected voltage generating means 60 for generating an expected gradation voltage. The subtractors 6 and the amplifiers 8 are the same as those provided in the prior art semiconductor testing apparatus 15 shown in FIG. 20, and hence detailed description is omitted. The expected voltage generating means 60 is the same as the expected voltage generating means 60 shown in FIG. 20, except that its precision is improved by correction. Gradation output voltages from the output terminals Y1–YM of a DUT are processed in a predetermined manner (see FIGS. 20 and 21) by the subtractors 6 serving as voltage difference detecting means, the amplifiers 8 serving as amplifying means, and the expected voltage generating means 60, and then inputted to the second semiconductor testing apparatus 200, whereby its acceptance or rejection is determined. Similarly to FIG. 21, the semiconductor testing apparatus 15 comprises, in the inside, a digital comparing section 11, tester controlling means 40, and a peripheral block section 12. When the high level comparison result output data (D1H-DMH) and the low level comparison result output data (D1L-DML) are fed back from the second semiconductor testing apparatus 200 through a signal line 200a to the expected voltage generating means 60, the use of the semiconductor testing apparatus 15 is not necessary. The expected voltage generating means 60 is composed of an electronic circuit for generating the expected gradation voltage.

The digital comparing section 11 performs digital comparison on the basis of the determination result (logic signals) provided from the second semiconductor testing apparatus 200, thereby converts the result into logical signals (D1–DM), and then provides the signals to the tester controlling means 40. When the second semiconductor testing apparatus 200 is constructed in the form of a module, the subtractors 6 and the amplifiers 8 can also be incorporated in the module. Such modular configuration shortens the electric length from the DUT to the comparators (52 and 53) in comparison with the case that the test is performed using the comparators (digital comparing section 11) inside the semiconductor testing apparatus 15. Obviously, this is preferable in noise resistance and the like. Since the second semiconductor testing apparatus 200 is used in the semiconductor testing apparatus (semiconductor test system) according to Embodiment 3, the common comparison voltage generation data IVHb and IVLb are provided from the tester controlling means 40 to the second semiconductor testing apparatus 200. The individual comparison voltage generation data (IVHc and IVLc) is processed inside the second semiconductor testing apparatus 200.

Even in the case that the comparators 52 and 53 provided in the second semiconductor testing apparatus 200 have a precision of the same order as the comparators (not shown) provided in the digital comparing section 11, the measurement precision can be improved by correcting the intrinsic error. However, in order to improve the precision further, it is preferable that the comparators 52 and 53 have a higher precision than the comparator provided in the digital comparing section 11.

[Embodiment 4]

Figure 5:
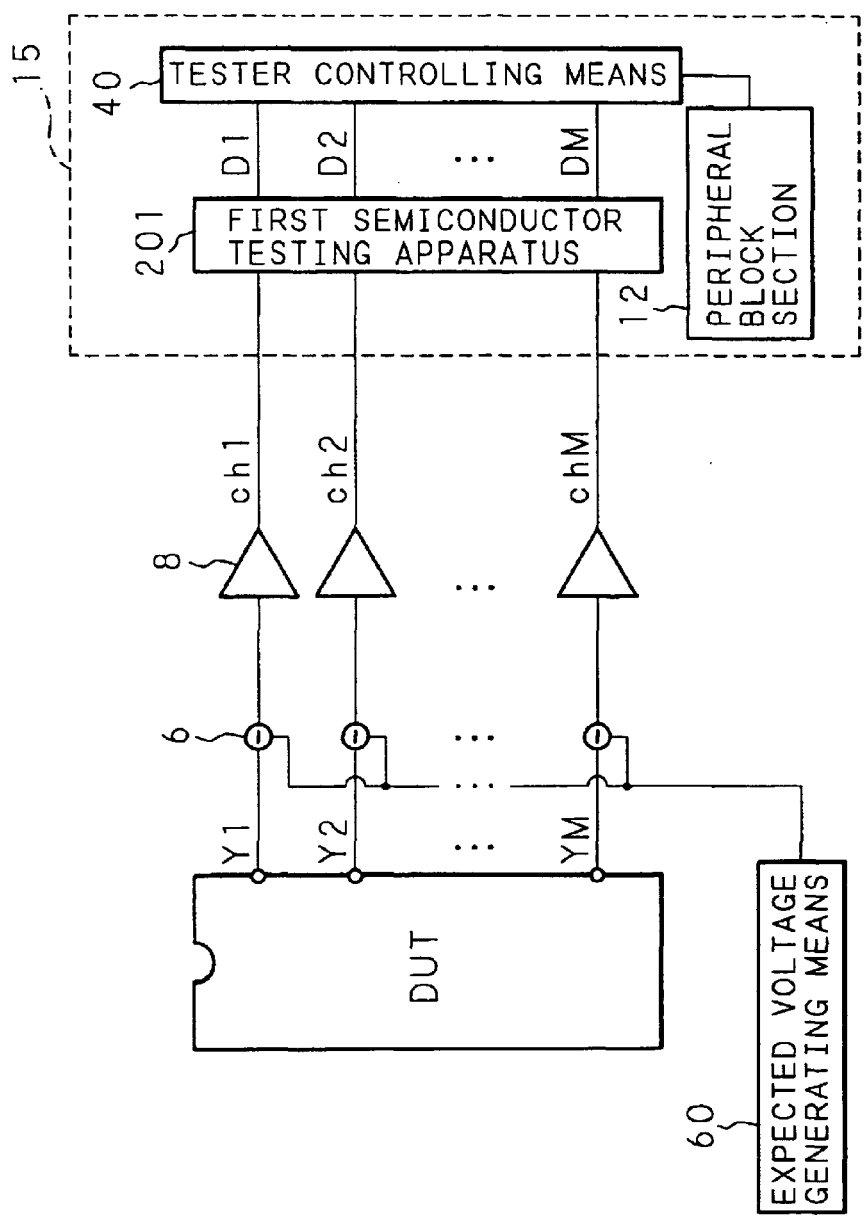
FIG. 5 is a block diagram schematically showing a block of a semiconductor testing apparatus according to the invention.

FIG. 5 is a block diagram schematically showing a block of a semiconductor testing apparatus according to the invention. In the present embodiment, the second semiconductor testing apparatus 200 together with the digital comparing section 11 is incorporated inside the semiconductor testing apparatus 15, and thereby constitutes a first semiconductor testing apparatus 201. Thus, the first semiconductor testing apparatus 201 has the function of the second semiconductor testing apparatus 200 as well as the function of the digital comparing section 11. There is no difference in the basic configuration from the semiconductor testing apparatus (semiconductor test system) of FIG. 4, and hence detailed description is omitted.

[Embodiment 5]

Figure 6:
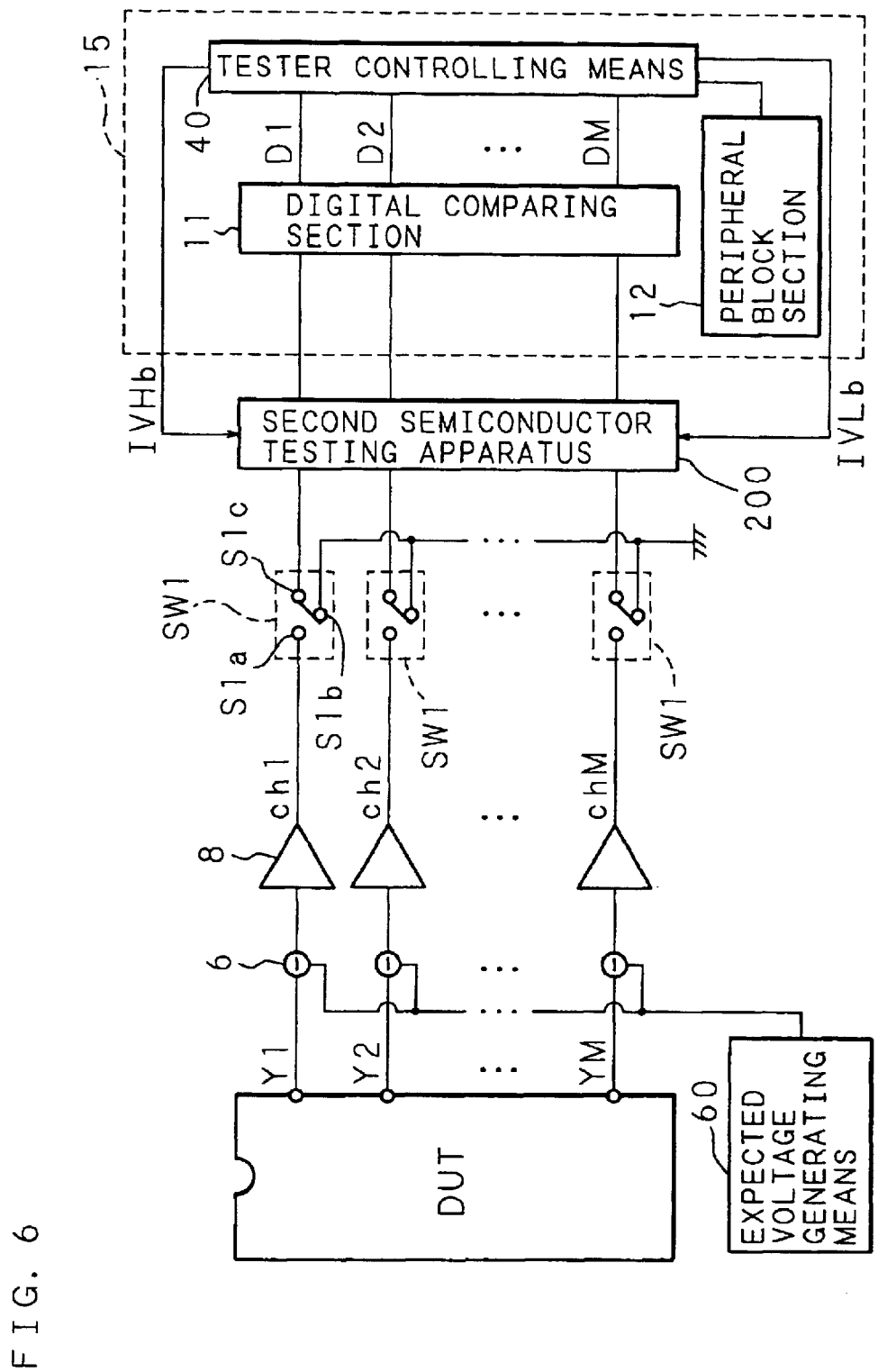
FIG. 6 is a block diagram illustrating a correction method for comparing means in output voltage testing means according to the invention.

FIG. 6 is a block diagram illustrating a correction method for comparing means in output voltage testing means according to the invention. The basic configuration is similar to that of the semiconductor testing apparatus (semiconductor test system) shown in FIG. 4, and hence detailed description is omitted. Gradation output voltages from the output terminals Y1–YM of a DUT are processed in a predetermined manner (see FIG. 21) by the subtractors 6, the amplifiers 8, and the expected voltage generating means 60, and then inputted to the second semiconductor testing apparatus 200. The semiconductor testing apparatus 15 comprises a digital comparing section 11, a peripheral block section 12, and tester controlling means 40. Signals from the second semiconductor testing apparatus 200 are inputted to the digital comparing section 11. The difference from the configuration of FIG. 4 is that a first correction switch SW1 is provided between each amplifier 8 and the second semiconductor testing apparatus 200. In each first correction switch SW1, a common terminal S1c is connected to the test voltage inputting means (51) of the second semiconductor testing apparatus 200, while a first independent terminal S1a is connected to the output terminal of the amplifier 8, and while a second independent terminal S1b is connected to a fixed potential terminal (ground point). When the gradation output voltage of the DUT is to be tested, the common terminal S1c is connected to the first independent terminal S1a. When the 0-V (zero-volt) correction (described later) of the comparators (52 and 53) is to be performed, the common terminal S1c is connected to the second independent terminal S1b. When the first correction switch SW1 is arranged in the vicinity of the second semiconductor testing apparatus 200, the fixed potential terminal (ground point) is secured, whereby noise resistance is improved in the semiconductor testing apparatus (semiconductor test system). When the first correction switches SW1 are integrated with the subtractors 6, the amplifiers 8, the expected voltage generating means 60, and the second semiconductor testing apparatus 200, into the form of a module, the prior art semiconductor testing apparatus 15 can be used intact, and still the precision is very easily improved in the semiconductor testing apparatus (semiconductor test system).

[Embodiment 6]

Figure 7:
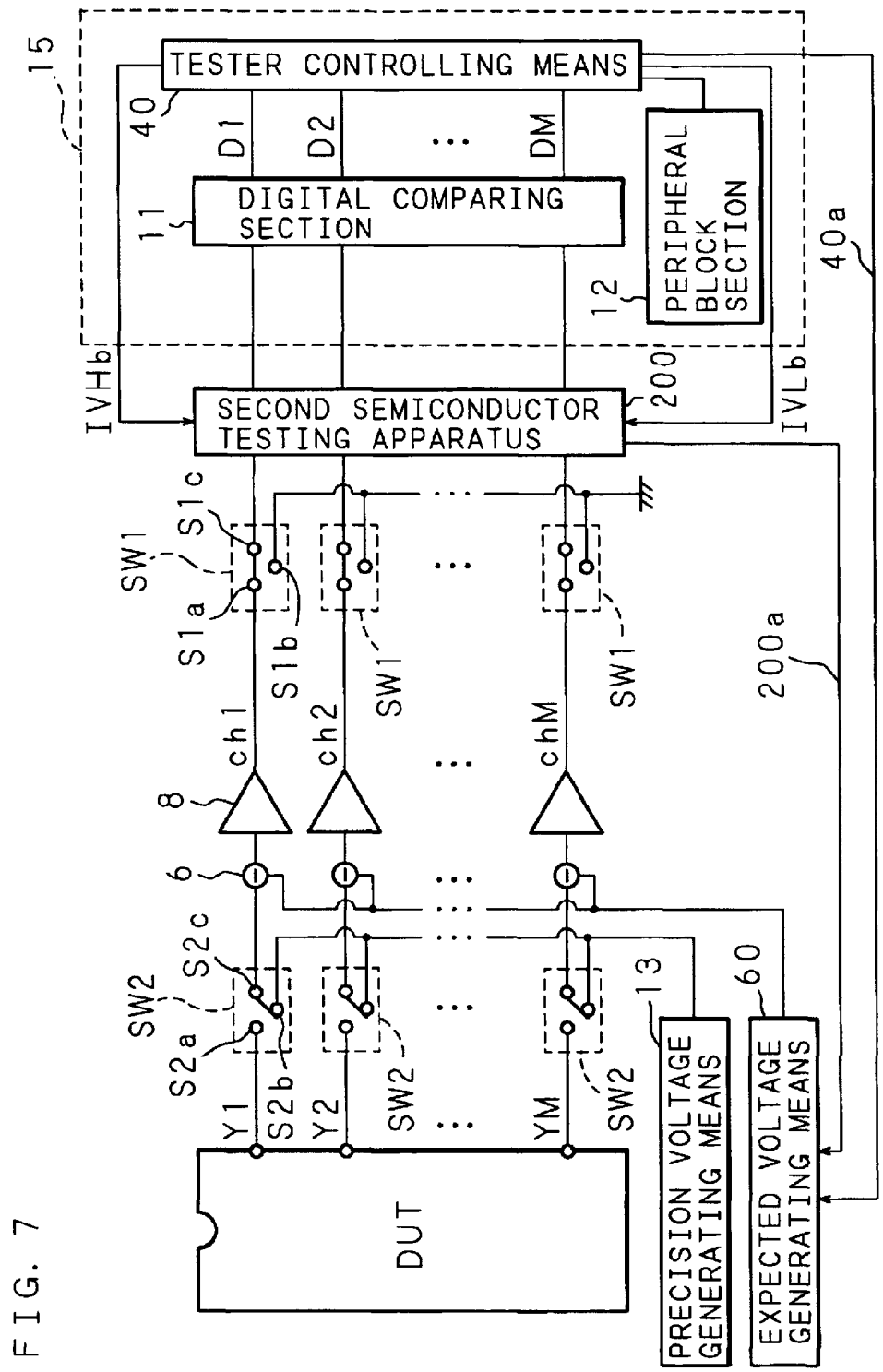
FIG. 7 is a block diagram illustrating a correction method in expected voltage generating means according to the invention.

FIG. 7 is a block diagram illustrating a correction method in expected voltage generating means according to the invention. The basic configuration is similar to that of the semiconductor testing apparatus (semiconductor test system) shown in FIG. 6, and hence detailed description is omitted. The difference from the configuration of FIG. 6 is that second correction switches SW2 are added. The second correction switch SW2 selects either the gradation output voltage from the DUT or the output from precision voltage generating means 13 as the signal to be inputted to the subtractor 6. In each second correction switch SW2, a common terminal S2c is connected to the subtractor 6, while a first independent terminal S2a is connected to an output terminal of the DUT, and while a second independent terminal S2b is connected to the precision voltage generating means 13. In this configuration, when the gradation output voltage of the DUT is to be tested, the common terminal S2c is connected to the first independent terminal S2a, while when the expected voltage generating means 60 is corrected (described later), the common terminal S2c is connected to the second independent terminal S2b. When the gradation output voltage of the DUT is tested, the first independent terminal S2a is connected to the common terminal S2c, while when the expected voltage generating means 60 is to be corrected, the common terminal S2c is connected to the second independent terminal S2b. At that time, the first correction switch SWI connects the amplifier 8 to the second semiconductor testing apparatus 200.

The output voltage of the amplifier 8 is amplified into an analogue signal having a voltage of ΔVK=24×(VKS−VKD) which is the difference voltage between the analogue output (VKS) of the precision voltage generating means 13 and the output (VKD) of the expected voltage generating means 60 amplified (by an amplification factor, for example, of 24). The analogue signal is inputted to the second semiconductor testing apparatus 200, while at least one of the comparison result output data (D1H–DMH and D1L–DML) of the second semiconductor testing apparatus 200 is inputted (fed back) through a signal line 200a to the expected voltage generating means 60. When the input (feedback) is performed from the tester controlling means 40 through a signal line 40a to the expected voltage generating means 60, the correction of the expected voltage generating means 60 is speeded up further. The precision voltage generating means 13 is composed of a secondary standard voltage generator or the like which is duplicated from a standard voltage generator prepared as a standardized prototype. Accordingly, the precision in the voltage generation in the precision voltage generating means 13 can be considered substantially as zero (in terms of error). When the second correction switches SW2 are integrated with the subtractors 6, the amplifiers 8, the first correction switches SW1, the expected voltage generating means 60, and the second semiconductor testing apparatus 200, into the form of a module, the prior art semiconductor testing apparatus 15 can be used intact, and still the precision is very easily improved in the semiconductor testing apparatus (semiconductor test system).

Figure 8:
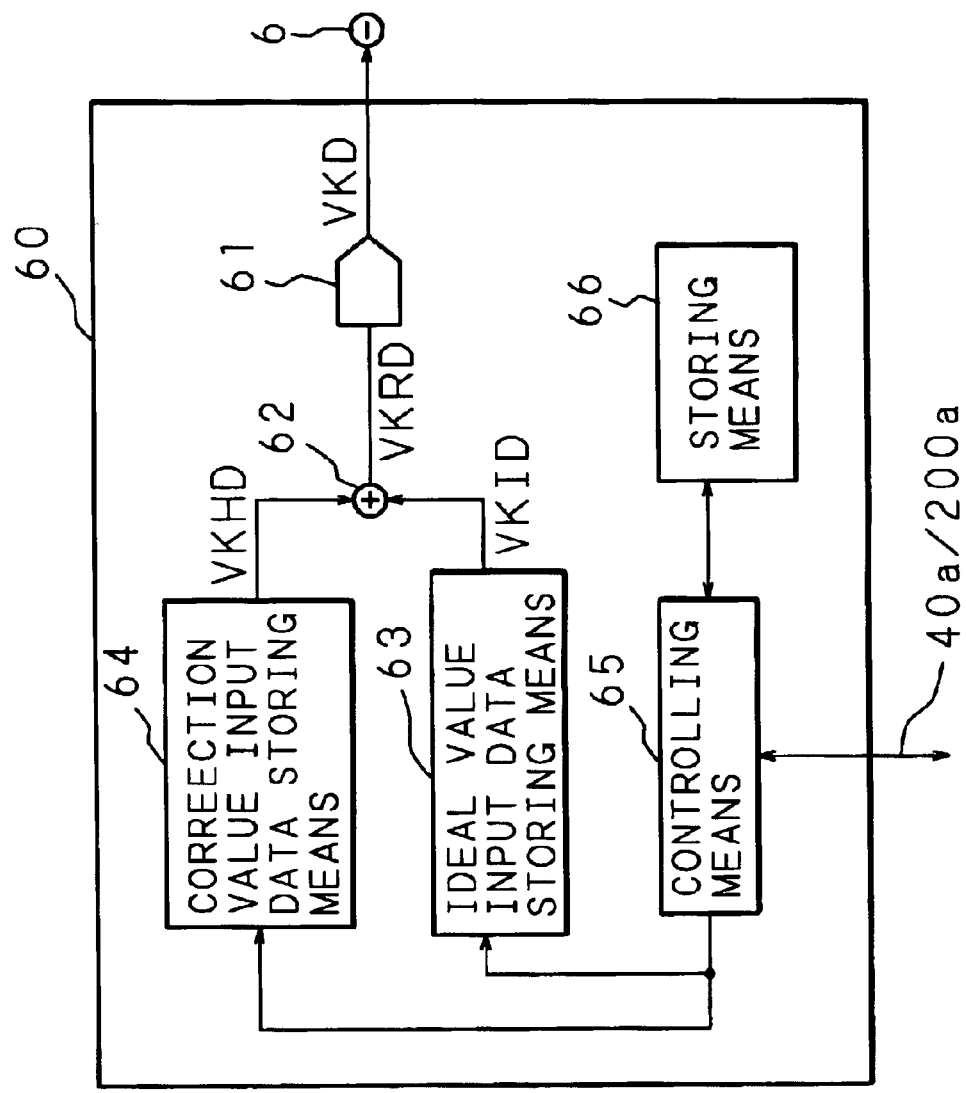
FIG. 8 is a block diagram showing the block configuration of expected voltage generating means according to the invention.
Figure 9:
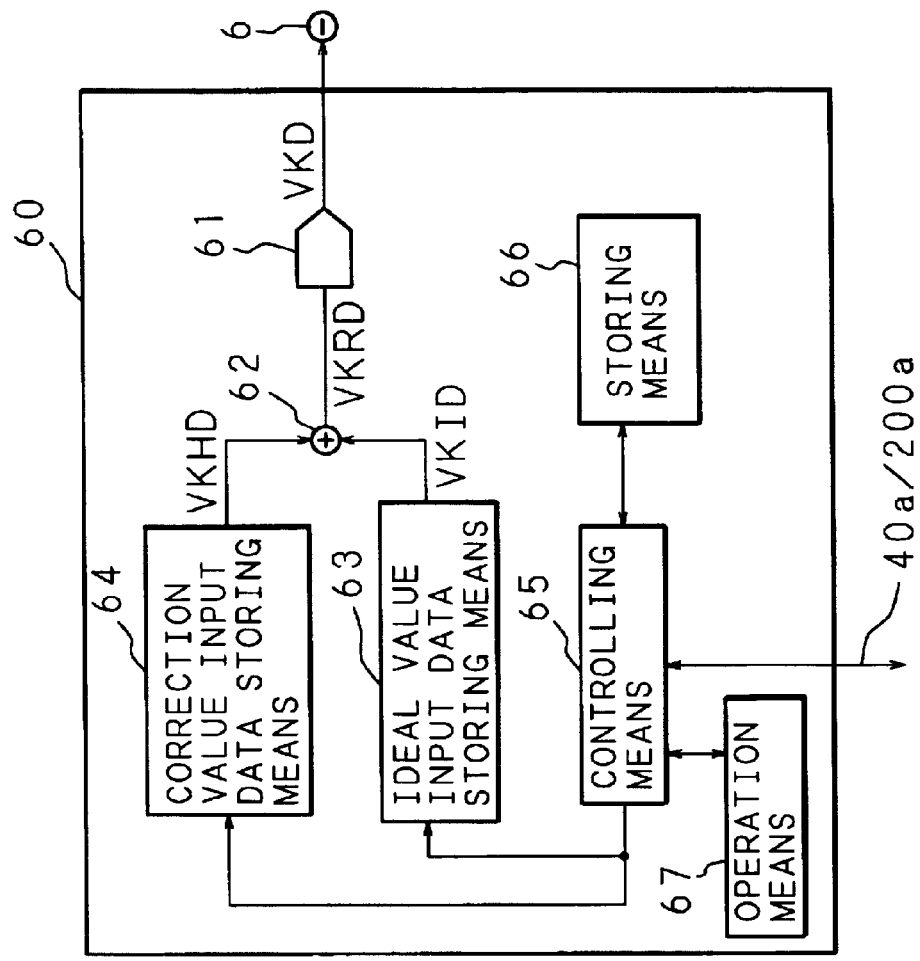
FIG. 9 is a block diagram showing the block configuration of expected voltage generating means according to the invention.

Each of FIGS. 8 and 9 is a block diagram showing the block configuration of expected voltage generating means according to the invention. The expected voltage generating means 60 is a constituting block for various correction in Embodiments 7–11. In FIG. 9, operation means 67 is added to the configuration of FIG. 8. The expected voltage generating means 60 comprises: an 18-bit DAC 61 constituting expected voltage outputting means; ideal value input data storing means 63 for storing ideal value input data (data to be inputted to the DAC 61 when no error is assumed) to be provided to the DAC 61; correction value input data storing means 64 for storing a correction input value for correcting the error of the DAC 61 relative to the ideal characteristics; and an operation means 67 for adding the ideal value input data VKID stored in the ideal value input data storing means 63 to the correction value input data VKHD stored in the correction value input data storing means 64 by means of an adder 62, and thereby generating input data VKRD to the DAC 61. The expected voltage generating means 60 further comprises: controlling means 65 for controlling these pieces of means; storing means 66; and data inputting and outputting means (not shown) for inputting and outputting data between the controlling means 65 and external devices (such as signal lines 40a and 200a, and the like).

The operation means 67 calculates: a gain correction coefficient; and correction value input data to be provided to the DAC 61 (see Embodiment 1). When the DAC 61 provided in the expected voltage generating means 60 has a higher resolution than the DACs 106 and 107 provided in the comparison voltage generating means, the precision is improved in the test. The use of the expected voltage generating means 60 is not limited to the application of semiconductor testing apparatuses and the like, but applicable to other purposes. The ideal value input data storing means 63 is composed of an ideal value input data memory device, while the correction value input data storing means 64 is composed of a correction value input data memory device. Similarly to the correction data storing means 215, the correction value input data storing means 64 is preferably composed of a non-volatile memory. Obviously, the expected voltage generating means 60 (the controlling means 65 and the operation means 67) may be implemented in the form of a computer comprising a CPU (central processing unit) and the like, whereby the operation may be realized by a software process.

The storing means 66 stores: a correction program which describes the correction processes; and a plural pieces of ideal value input data and correction data to be provided to the DAC 61. The controlling means 65 and the storing means 66 may be provided in an external device such as the semiconductor testing apparatus 15. However, in the case that these pieces of means are provided inside, the correction can be performed without an expensive semiconductor testing apparatus 15. In the case that these pieces of means are provided in an external device, the expected voltage generating means 60 has a simplified configuration. The amplification factor of the amplifier 8 is set to be 24 similarly to the case of the comparator error correction.

The output of the DAC 61 serving as the expected voltage outputting means provided in the expected voltage generating means 60 is provided to the subtractor 6 (see FIGS. 6 and 7), and thereby serves as a reference voltage (expected gradation voltage) for generating the difference voltage between the expected gradation voltage and the gradation output voltage. Accordingly, the output needs to be as precise as possible. Thus, an 18-bit specification for the DAC has been selected. However, the number of necessary bits is determined depending on the specification of the device. Thus, the invention is not limited to the 18-bit specification. The maximum output of the DAC 61 is, for example, 13 V. Accordingly, the resolution of the DAC 61 is 13 V/$2^{18}$, that is, 0.050 mV/bit.

[Embodiment 7]

Embodiment 7 relates to a correction method for a semiconductor testing apparatus according to the invention. The basic process is as follows.

A 0-V (zero-volt) correction is first performed on any one of the comparators 52 and 53 provided in the output voltage testing means 50, and then a correction other than 0 V is performed in an appropriate manner. After that, similar corrections are performed on the other comparator. Further, a 0-V correction is performed on the expected voltage generating means 60, and then a correction other than 0 V is performed in an appropriate manner.

The expected voltage correction method for the expected voltage generating means 60 is to be performed by the following steps.

The method comprises: a correction reference voltage inputting step of inputting a correction reference voltage serving as the correction reference; a correction reference voltage increasing and decreasing step of increasing or decreasing the correction reference voltage depending on a comparison result corresponding to the correction reference voltage; a comparison result detecting step of detecting whether the comparison result changes or not; and a correction data storing step of repeating the correction reference voltage increasing and decreasing step when the comparison result does not change, and of stopping the correction reference voltage increasing and decreasing operation and then storing the present correction voltage data when the comparison result has changed.

A method for correcting the intrinsic error of a digital-to-analogue converter and the like is described below with reference to FIGS. 6, 7, 8, and 1.

The measurement error is assumed, for example, to be 20 mV in the comparators 52 and 53 provided in the second semiconductor testing apparatus 200 (semiconductor testing apparatus 200). The DACs 106 and 107 for comparator reference voltage (VOHS and VOLS) generation have a 14-bit configuration each and the maximum voltage, for example, of ±2.560 V (Vp-p=5.120 V) depending on the specification of the comparators 52 and 53. The DAC 61 for reference voltage generation provided in the expected voltage generating means 60 has an 18-bit configuration and the maximum generation voltage of 13 V. This maximum voltage of 13 V corresponds to the maximum output voltage of 13 V in the output specification of the DUT. When the later-described 0-V correction of the comparators is performed, the first correction switch SWI connects the common terminal S1c to the second independent terminal S1b (the fixed potential terminal (ground point)).

A 0-V potential is inputted (the fixed potential terminal (ground point) is connected) to the comparators 52 and 53 to be corrected. It is assumed that the DACs 106 and 107 incorporated in the semiconductor testing apparatus 200 are of 14 bits each, and that the absolute value of the maximum output voltage is 5.120 V. Accordingly, the resolution of the DACs 106 and 107 is 5.120 V/$2^{14}$=0.3 mV/bit. As for the order of correction operation, any one of the high level comparator 52 and the low level comparator 53 of FIG. 1 may be corrected first.

Outlined steps (Outlined Steps 1–6) of a method for obtaining a 0-V correction value for the comparator 52 are as follows. The correction for the comparator 53 is similar.

Outlined Step 1:

First, the input data is set to be a value corresponding to the ideal characteristics under the assumption that the DAC 61 corresponding to the ideal value input data storing means 63 of the expected voltage generating means 60 is an ideal DAC. This setting is performed by inputting the data from the tester controlling means 40 to the controlling means 65 and by storing and reading the data into and from the ideal value input data storing means 63. The correction value input data is similarly set by storing and reading the data into and from the correction value input data storing means 64.

Outlined Step 2:

The initial value for the correction value is set to be a value greater than the maximum error range determined by the specification of the circuit section to be subjected to error correction such as the comparator 52. For example, when the maximum error (specification) is +64 mV, the initial value is set to be +128 mV which is twice the maximum error. Since the comparator 52 is a comparator for high-level side comparison, the value VOHS on the positive terminal of the comparator 52 is set via VOH correction data inputting means (individual comparison voltage generation data inputting means 101c).

Outlined Step 3:

At the beginning, the setting condition is that of Outlined Step 2. Accordingly, the correction value exceeds the allowable error limit. Thus, the output (for example, the final output is DMH in the channel chM) of the comparator 52 becomes either high or low.

Outlined Step 4:

The correction value for the next step is obtained such that the absolute value is half the present correction value (+128 mV) and that the polarity is reversed (negative polarity when the present polarity is positive). (As a result, the next correction value is −64 mV.)

Outlined Step 5:

The correction value is set to be the value of −64 mV obtained in Outlined Step 4. At that time (when the −64 mV is inputted through the VOH correction data inputting means), in the case that the output state of the comparator 52 becomes reverse to the preceding state, that is, when the output of the comparator 52 changes from high to low or alternatively from low to high, the correction value for the next step is set such that the present correction value (−64 mV) is changed by half the changed amount of the correction value of the step that the present correction value has been obtained, and such that the changing direction is reversed relative to the preceding changing direction. That is, the change from +128 mV to −64 mV equals −192 mV (this is the changed amount of the correction value of the step that the present correction value has been obtained). This indicates that the changed amount is 192 mV and that the changing direction is negative. Accordingly, the amount to be changed for the next correction value equals 192 mV/2=96 mV, while the direction of the correction is the increasing, namely positive direction. As a result, the next correction value is set to be +32 mV which is the preceding correction value of −64 mV plus the amount of +96 mV which is to be changed for the next correction value.

In the case that the output state of the comparator 52 is the same as the preceding state, that is, when the state of high or low is unchanged, the correction value for the next step is set such that the present correction value (−64 mV) is changed by half the changed amount of the correction value of the step in which the present correction value has been obtained, and such that the changing direction is the same as the preceding changing direction. That is, the change from +128 mV to −64 mV equals −192 mV. This indicates that the changed amount is 192 mV and that the changing direction is negative. Accordingly, the amount to be changed for the next correction value equals 192 mV/2=96 mV, while the direction of the correction is the decreasing, namely negative direction. As a result, the next correction value is set to be −160 mV which is the preceding correction value of −64 mV plus the amount of −96 mV which is to be changed for the next correction value.

Outlined Step 6:

The correction value at the time when the amount to be changed becomes smaller than the value of the resolution of the comparator 52 is determined as the final correction value.

In the above-mentioned method, for the purpose of correcting the intrinsic error of the circuit to be corrected such as a comparator and a DAC, the setting of the correction value is repeated with determining the change in the output state (logic state of the output), whereby the setting value for the correction value is converged successively. This permits the compensation of the error in the circuit to be corrected. This method is a fast correction-value searching method applicable to circuits to be corrected such as comparators and DACs which require error correction.

The correction method for the circuit to be corrected is described below in further detail.

[Embodiment 8]

Embodiment 8 relates to a correction method (correction procedure) for a high level comparator 52 having an intrinsic error of +20 mV. The next Embodiment 9 describes a correction method (correction procedure) for a low level comparator 53 having an intrinsic error of +10 mV.

A. Initial Setting in Correction Method for 0-V Correction Value of High Level Comparator 52

The 0-V correction value indicates a correction value (correction input data) corresponding to ideal characteristics of 0 V.

In FIG. 6, the voltages VOH and VOL obtained from the common comparison voltage generation data (IVHb and IVLb) provided from the tester controlling means 40 to the second semiconductor testing apparatus 200 are set to be 0.000 V (voltage values are used in place of the data values, hereafter also for the other data). The initial values of the correction data are set to be 128 mV and −2.500 V, respectively. These values are selected such that the voltage inputted to the high level comparator 52 (simply the comparator 52, hereafter) is sufficiently greater than the error limit, and that the initial output value of the comparator 52 can be set to be a predetermined value regardless of the value of the measurement error of the comparator. The VOH initial value is desired to be as small as possible from the perspective of reducing the correction time. Thus, a value smaller than VOL is selected. The common terminal S1c and the second independent terminal S1b of the first correction switch SW1 are interconnected, whereby the input voltage (corresponding to the voltage to be tested) to the comparator 52 is set to be 0.000 V. The DAC (comparison voltage generating means) 106 corresponding to the comparator 52 is provided with digital data corresponding to 128 mV+0.000 V, that is, 128 mV. The DAC (comparison voltage generating means) 107 corresponding to the low level comparator 53 is provided with digital data corresponding to −2.500 V+0.000 V, that is, −2.500V.

B. Correction Method for 0-V Correction Value of High Level Comparator 52

In the following description, a correction is performed to the extent that the achieved precision satisfies the measurement precision required in the device specification of the DUT, in the case that the error of the comparator 52 is +20 mV, that is, in the case of an error which causes the effective input voltage to be equal to the correction voltage (voltage converted from the individual comparison voltage generation data IVHc) inputted to the positive input terminal of the comparator 52 plus +20 mV. FIG. 10 is a status table showing the status in each step of a correction method for the 0-V correction value of a high level comparator. In the figure, the column "IVHc CORRECTION VALUE" corresponds to the individual comparison voltage generation data IVHc, however, voltage values are used herein for simplicity. The column "POSITIVE TERMINAL INPUT VOLTAGE (EFFECTIVE INPUT VOLTAGE)" corresponds to an effective value including the error. The column "COMPARATOR OUTPUT" corresponds to the output state (logic high/low) of the comparator 52. The column "ERROR" corresponds to the final error obtained by the correction using the correction value. The column "STEP" corresponds to the step number used blow. The values shown in the column "ERROR" are those from which the quantization error in the DAC is removed. In the correction of the comparator 52, the low level comparator 53 is not mentioned. However, its output is always low. It is assumed that the voltage inputted to the negative input terminal of the comparator 52 is 0.000 V (fixed), that the VOH is 0.000 V (fixed), and that the VOL is −2.500 V (fixed).

Step 1:

The output of the comparator 52 in the initial state is checked (whether high or low). In the initial state, the effective input voltage to the positive input terminal is +148 mV (that is, +128 mV+20 mV). Thus, the output of the comparator 52 is high. As a result, it is confirmed that the error voltage is −128 mV or higher.

Step 2:

Digital correction data is set corresponding to −128 mV×½=−64 mV. Since the effective input voltage to the positive input terminal is −44 mV (that is, −64 mV+20 mV), the output is low. As a result, it is confirmed that the error voltage is +64 mV or lower.

Step 3:

Digital correction data is set corresponding to −(148 mV+44 mV)×½−64 mV=+32 mV. Since the effective input voltage to the positive input terminal is +52 mV, the output is high. As a result, it is confirmed that the error voltage is −32 mV or higher.

Step 4:

Digital correction data is set corresponding to −(96 mV)×½+32 mV=−16 mV. Since the effective input voltage to the positive input terminal is +4 mV, the output is high, and this high output is successive to the preceding one. As a result, it is confirmed that the error voltage is +16 mV or higher.

Step 5:

When the output state of the comparator 52 has not changed, the next correction value is set to be the present correction value (correction value obtained in Step 4, in this case) plus the amount Δn to be changed. The amount Δn to be changed is half the preceding amount Δ(n−1) (that is, the correction value obtained in Step 4 minus the correction value obtained in Step 3) to be changed for the correction value. The polarity of the changing is the same as the preceding one.

$$\Delta(n-1) = +32 \text{ mV} - (-16 \text{ mV}) = +48 \text{ mV and}$$

$$\Delta n = +48 \text{ mV} \times 1/2 = +24 \text{ mV}$$

The next correction value is set to be digital correction data corresponding to −16 mV −24 mV=−40 mV. Since the effective input voltage to the positive input terminal is −20 mV, the output is low. As a result, it is confirmed that the error voltage is +40 mV or lower.

Step 6:

When the output state of the comparator 52 has changed, the next correction value is set to be the present correction value (correction value obtained in Step 5, in this case) plus the amount Δm to be changed. The amount Δm to be changed is half the preceding amount Δ(m−1) (that is, the correction value obtained in Step 5 minus the correction value obtained in Step 4) to be changed for the correction value. The polarity of the changing is reversed relative to the preceding one. The preceding amount to be changed is 24 mV, while the changing direction is negative. Thus, the next amount to be changed is 12 mV, while the changing direction is positive. As a result, the next correction value is as follows.

$$\text{Next correction value} = \text{Present correction value} + 12 \text{ mV}$$

$$= -40 \text{ mV} + 12 \text{ mV} = -28 \text{ mV}.$$

Thus, the next correction value is set to be digital correction data corresponding to −28 mV. Since the effective input voltage to the positive input terminal is −8 mV, the output is low. As a result, it is confirmed that the error voltage is +28 mV or lower.

Step 7:

Since the output state of the comparator 52 has not changed, the next correction value is obtained similarly to Step 5. The next amount to be changed is +12 mV×½=+6 mV, while the changing direction is positive.

$$\text{Next correction value} = \text{Present correction value} + 6 \text{ mV}$$

$$= -28 \text{ mV} + 6 \text{ mV} = -22 \text{ mV}.$$

Thus, the next correction value is set to be digital correction data corresponding to −22 mV. Since the effective input voltage is −2 mV, the output is low. As a result, it is confirmed that the error voltage is +22 mV or lower.

Step 8:

Since the output state of the comparator 52 has not changed, the next correction value is obtained similarly to Step 5. The next amount to be changed is +6 mV ×½=+3 mV, while the changing direction is positive.

$$\text{Next correction value} = \text{Present correction value} + 3 \text{ mV}$$

$$= -22 \text{ mV} + 3 \text{ mV} = -19 \text{ mV}.$$

Thus, the next correction value is set to be digital correction data corresponding to −19 mV. Since the effective input voltage is +1 mV, the output is high. As a result, it is confirmed that the error voltage is +19 mV or higher.

Step 9:

Since the output state of the comparator 52 has changed, the next correction value is obtained similarly to Step 6. The next amount to be changed is 3 mV×½=1.5 mV, while the changing direction is negative.

$$\text{Next correction value} = \text{Present correction value} - 1.5 \text{ mV}$$

$$= -19 \text{ mV} - 1.5 \text{ mV} = -20.5 \text{ mV}.$$

Thus, the next correction value is set to be digital correction data corresponding to −20.5 mV. Since the effective input voltage is −0.5 mV, the output is low. As a result, it is confirmed that the error voltage is +20.5 mV or lower.

Step 10:

Since the output state of the comparator 52 has changed, the next correction value is obtained similarly to Step 6. The next amount to be changed is 1.5 mV×½=0.75 mV, while the changing direction is positive.

$$\text{Next correction value} = \text{Present correction value} + 0.75 \text{ mV}$$

$$= -20.5 \text{ mV} + 0.75 \text{ mV} = -19.75 \text{ mV}.$$

Thus, the next correction value is set to be digital correction data corresponding to −19.75 mV. Since the effective input voltage is +0.25 mV, the output is high. As a result, it is confirmed that the error voltage is +19.75 mV or higher.

Step 11:

Since the output state of the comparator 52 has changed, the next correction value is obtained similarly to Step 6. The next amount to be changed is 0.75 mV×½=0.375 mV, while the changing direction is negative.

$$\text{Next correction value} = \text{Present correction value} - 0.375 \text{ mV}$$

$$= -19.75 \text{ mV} - 0.375 \text{ mV} = -20.125 \text{ mV}.$$

Thus, the next correction value is set to be digital correction data corresponding to −20.125 mV. Since the effective input voltage is −0.125 mV, the output is low. As a result, it is confirmed that the error voltage is +20.125 mV or lower.

Step 12:

Since the output state of the comparator 52 has changed, the next correction value is obtained similarly to Step 6. The next amount to be changed is 0.375 mV×½=0.1875 mV, while the changing direction is positive.

$$\text{Next correction value} = \text{Present correction value} + 0.1875 \text{ mV}$$

$$= -20.125 \text{ mV} + 0.1875 \text{ mV} = -19.9375 \text{ mV}.$$

Thus, the next correction value is set to be digital correction data corresponding to −19.9375 mV. Since the effective input voltage is +0.0625 mV, the output is high. As a result, it is confirmed that the error voltage is +19.9375 mV or higher. At this time, the correction error is +0.0625 mV.

Since the resolution of the DAC 106 corresponding to the high level comparator 52 is 0.03 mV, further correction is not performed. As such, 11 correction operations after the initial setting have reduced the initial error of 20 mV into the error of 0.0625 mV. The resolution of the comparator 52 is 0.3 mV. Thus, with considering an uncertainty error of 0.15 mV, the obtained error falls within a range between +0.15625 mV and −0.14375 mV. The output specification of the DUT to be measured is, for example, the maximum output voltage of 13 V and the output in 512 gradation levels. Accordingly, the voltage difference per gradation level is 25.39 mV when equal spacing is assumed, although actual spacing depends on the γ-correction. Thus, required precision in the voltage measurement is 25.39 mV/4=6.35 mV or the like in terms of the inter-output terminal deviation voltage. Accordingly, the correction according to the present embodiment permits sufficiently accurate measurement. It should be noted that in some cases in 256-gradation level or higher liquid crystal display driving apparatuses, the specification of the inter-output terminal deviation voltage is half the adjacent voltage difference per gradation level, and that the present embodiment obviously permits sufficiently accurate measurement also in these cases.

In the case that the output specification of the DUT to be measured is the maximum output voltage of 13 V and the output in 1024 gradation levels, the voltage difference per gradation level is 12.69 mV when equal spacing is assumed. Thus, required precision in the voltage measurement is 12.69 mV/4=3.174 mV or the like in terms of the inter-output terminal deviation voltage. Accordingly, the present embodiment which achieves the correction with an error range of 0.15 mV permits sufficiently accurate measurement.

[Embodiment 9]

Correction Method for 0-V Correction Value of Low Level Comparator 53.

Described below is a correction method (correction procedure) similar to that of Embodiment 8 and applied to a low level comparator 53 having an intrinsic error of +10 mV.

The low level comparator 53 can be corrected similarly. The initial setting is assumed that the negative terminal input voltage=0.000 V (fixed), VOH=2.500 V (fixed), VOL=0.000 V (fixed), and IVLb=−128 mV. FIG. 11 is a status table showing the status in each step of a correction method for the 0-V correction value of a low level comparator. In the figure, the column "IVLc CORRECTION VALUE" corresponds to the individual comparison voltage generation data IVLc, however, voltage values are used herein for simplicity. The other columns are the same as those of FIG. 10. The method according to the present embodiment is basically the same as that of Embodiment 8, and hence detailed description of Steps 21–32 is omitted. The values shown in the column "ERROR" are those from which the quantization error in the DAC is removed. It is assumed that the voltage inputted to the positive input terminal of the low level comparator 53 is 0.000 V (fixed), and that VOL=0.000 V (fixed) and VOH=2.500 V (fixed).

As such, the correction data for the high level comparator 52 and the low level comparator 53 of a predetermined channel is determined and then stored in the correction data storing means (numeral 215; see FIG. 3). Such an operation is performed for all channels requiring the correction. Here, it is preferable that the correction data once determined is maintained even after the testing apparatus is powered off, because this avoids the necessity of re-determining the correction values after the apparatus is powered on next time. Thus, the storing means is preferably composed of a non-volatile memory.

[Embodiment 10]

In the case that the expected voltage generating means 60 of FIG. 9 has an error, that is, in the case that the DAC 61 provided in the expected voltage generating means 60 has an error, the error needs to be corrected. In the present embodiment, DAC input data (ideal value input data VKID) which is data under the assumption that the DAC is ideal one having no error is added to error correction data (correction value input data VKHD), and then this addition data (real input data VKRD; the output of the adder 62) is provided as digital input data to the DAC 61, whereby the error is corrected in the generated voltage from the expected voltage generating means 60. The error of the DAC 61 includes an offset error and an amplification factor error. The offset error indicates the voltage value outputted from the DAC 61 when digital data which would cause an ideal-characteristic DAC to output 0 V is provided as the input data to the DAC 61. Embodiment 10 describes a correction method for the offset error in the expected voltage generating means 60. The next Embodiment 11 describes a correction method for the amplification factor error (gain error). The specification of the DUT is the same as that of Embodiments 9 and 10.

A. Correction Method for Offset Error of Expected Voltage Generating Means 60

The offset error is corrected in the following correction procedure in an exemplary case that the offset error is −10 mV. In the case of the error of −10 mV, the measurement precision is insufficient because the voltage difference per gradation level is 25.39 mV in the DUT to be tested. In the following description, the input data to the DAC (that is, ideal value input data VKID, correction value input data VKHD, and real input data VKRD) are expressed in terms of voltage values corresponding to respective digital input. Outlined steps (Outlined Steps 10–15) of a method for correcting the expected voltage generating means 60 are as follows.

Outlined Step 10:

First, the data to be stored in the ideal value input data storing means 63 is set to be the value of the ideal DAC input data (ideal value input data VKID) corresponding to the voltage of the precision voltage generating means 13 (see FIG. 7).

Outlined Step 11:

The initial value for the correction value is set to be a value greater than the maximum error range determined from the specification of the circuit section under error correction such as the DAC 61. For example, when the maximum error (specification) of the output of the DAC 61 is +64 mV, the initial value is set to be +128 mV which is twice the maximum error. Under this setting condition, since the correction value exceeds the allowable error limit. Thus, the output (for example, the final output is DML in the channel chM) of the comparator 53 becomes either high or low.

Outlined Step 12:

The correction value for the next step is set such that the absolute value is half the present correction value (+128 mV) and that the polarity is reversed. That is, the next correction value is set to be −64 mV.

Outlined Step 13:

At that time, in the case that the output state of the comparator 53 becomes reverse to the preceding state, that is, when the output of the comparator changes from high to low or alternatively from low to high, the correction value for the next step is set such that the present correction value (−64 mV) is changed by half the changed amount of the correction value of the step that the present correction value has been obtained, and such that the changing direction is reversed relative to the preceding changing direction. That is, the change from +128 mV to −64 mV equals −192 mV. This indicates that the changed amount is 192 mV and that the changing direction is negative. Accordingly, the amount to be changed for the next correction value equals 192 mV/2=96 mV, while the direction of the correction is the increasing and positive direction. As a result, the next correction value is set to be +32 mV which is the preceding correction value of −64 mV plus the amount of +96 mV which is to be changed for the next correction value.

Outlined Step 14:

In the case that the output state of the comparator 53 is the same as the preceding state, that is, when the state of high or low is unchanged, the correction value for the next step is set such that the present correction value (−64 mV) is changed by half the changed amount of the correction value of the step in which the present correction value has been obtained, and such that the changing direction is the same as the preceding changing direction. That is, the change from +128 mV to −64 mV equals −192 mV. This indicates that the changed amount is 192 mV and that the changing direction is negative. Accordingly, the amount to be changed for the next correction value equals 192 mV/2=96 mV, while the direction of the correction is the decreasing and negative direction. As a result, the next correction value is set to be −160 mV which is the preceding correction value of −64 mV plus the amount of −96 mV which is to be changed for the next correction value.

Outlined Step 15:

The correction value is corrected repeatedly in such a manner. The correction value at the time when the amount to be changed becomes smaller than the value of the resolution of the device such as a compare and a DAC to be corrected is determined as the final correction value. This method is a fast correction-value searching method applicable regardless of whether the circuit to be corrected is a comparator or a DAC.

B. Initial Setting in Correction Method for Offset Error of Expected Voltage Generating Means 60

The Initial setting in a correction method for the offset error of the expected voltage generating means 60 is described below with reference to FIGS. 7–9 and 1.

The initial setting state of the comparators 52 and 53 is that VOH=0.00 mV and VOL=0.00 mV. The comparator correction data (IVHc and IVLc) is set to be the values obtained in the process of the correction of the comparators 52 and 53. The output voltage VKS of the precision voltage generating means 13 is set to be 100 mV. The ideal value input data VKID stored in the ideal value input data storing means 63 is 100 mV (corresponding to VKS). The correction value input data VKHD of the correction value input data storing means 64 is 128 mV. The value of 128 mV has been selected as a value greater than an expected error and permitting the detection of the correction value to be as efficient as possible. Here, the maximum error range of the DAC 61 of the expected voltage generating means 60 is +128 mV. Thus, since the error at +13 V output is +128 mV at maximum, the 128 mV has been selected as the initial correction value.

The output VKRD of the adder 62 is 228 mV (VKID 100 mV+VKHD 128 mV). Since the offset error of the DAC 61 is −10 mV, the effective output voltage VKD of the DAC 61 equals 218 mV (228 mV−10 mV). The difference voltage (the input to the amplifier 8) between the output voltage VKS of the precision voltage generating means 13 and the effective output voltage VKD of the DAC 61 is −118 mV, the output voltage ΔVK of the amplifier 8 equals (−118 mV)× 24=−2832 mV. As a result, since each of the reference voltages (VOH and VOL) of the two comparators 52 and 53 provided in the second semiconductor testing apparatus 200 is 0.00 mV, the comparison result outputs DMH and DML become low and high, respectively. The correction can be performed using any one of the data of comparison result outputs DMH and DML. However, the correction processes shown in FIG. 12 are performed on the basis of the data of the comparison result output DML (comparator 53). The output voltage VKS of the precision voltage generating means 13 and the ideal value input data VKID are maintained at 100 mV unless mentioned otherwise.

FIG. 12 is a status table showing the status in each step of a correction method for the offset error of expected voltage generating means. The offset error of the expected voltage generating means 60 is −10 mV as described above. In the figure, in respective "DAC" columns, the "IDEAL INPUT DATA VKID" corresponds to the ideal value input data VKID, while the "CORRECTION INPUT DATA VKHD" corresponds to the correction value input data VKHD, and while the "EFFECTIVE OUTPUT VOLTAGE VKD" corresponds to the effective output voltage VKD. In respective "AMPLIFIER" columns, the "INPUT VOLTAGE" indicates the difference voltage between the output voltage VKS of the precision voltage generating means 13 and the effective output voltage VKD of the DAC 61, while the "OUTPUT VOLTAGE" indicates the output voltage ΔVK of the amplifier 8. The column "COMPARATOR OUTPUT VOLTAGE" indicates the logic state (high or low) of the comparison result output of the comparator 53. The column "STEP" corresponds to the step number used blow. The columns for "DATA" are expressed in terms of the corresponding voltages for simplicity.

Step 41:

The comparator output in the initial state is checked. In the initial state, the effective output voltage VKD of the DAC 61 is 218 mV. The output voltage ΔVK of the amplifier 8 is (−118 mV)×24=−2832 mV. The output voltage ΔVK is inputted to the comparator 53 provided in the second semiconductor testing apparatus 200, whereby the low level comparison result output data DML (output data DML, in some cases hereafter) is low.

It is found that the reference voltage (output voltage VKD) which is the correction value input data VKHD of the DAC 61 plus the correction of 128 mV is higher than the voltage to be compared (output voltage VKS of the precision voltage generating means 13; corresponding to the ideal value input data VKID) which is 100 mV. As a result, it is confirmed that the error voltage is −128 mV or higher.

Step 42:

The DAC 61 correction value corresponding to (−1)×128 mV×½=−64 mV is set into the correction value input data storing means 64. (A value smaller than the correction value in Step 41 (S41, hereafter) by 192 mV is set.) The effective output voltage VKD of the DAC 61 equals 26 mV.

$$VKD = \text{ideal value input data setting value} +$$
$$\text{correction value input data setting value} + \text{error value}$$
$$= 100 \text{ mV} + (-64 \text{ mV}) + (-10 \text{ mV}) = 26 \text{ mV}$$

The output voltage ΔVK of the amplifier 8 equals 1776 mV according to the calculation similar to S41.

$$\Delta VK = \{\text{output voltage VKS of the precision voltage generating}$$
$$\text{means 13} - \text{effective voltage VKD of the expected voltage}$$
$$\text{generating means 60 (effective output voltage of the DAC 61)}\} \times$$
$$\text{amplification factor}$$
$$= (100 \text{ mV} - 26 \text{ mV}) \times 24 = 1776 \text{ mV}.$$

The comparison result output DML of the comparator 53 is high. That is, the reference voltage (output voltage VKD) generated by the data which is the input data of the DAC 61 plus the correction of −64 mV is lower than the voltage to be compared which is 100 mV. As a result, it is confirmed that the error voltage is 64 mV or lower.

Step 43:

The DAC 61 correction value corresponding to (−1)×(−64 mV)×½=32 mV is set into the correction value input data storing means 64. (A value greater than the correction value in S42 by 96 mV is set.) The effective output voltage VKD of the DAC 61 equals 122 mV, while the output voltage ΔVK of the amplifier 8 equals (−22 mV)×24=−528 mV. The comparison result output DML of the comparator 53 is low. That is, the reference voltage (output voltage VKD) generated by the data which is the input data of the DAC 61 plus the correction of 32 mV is higher than the voltage to be compared which is 100 mV. As a result, it is confirmed that the error voltage is −32 mV or higher.

Step 44:

The DAC 61 correction value corresponding to (−1)×(32 mV)×½=−16 mV is set into the correction value input data storing means 64. (A value smaller than the correction value in S43 by 48 mV is set.)

The effective output voltage VKD of the DAC 61 equals 74 mV, while the output voltage ΔVK of the amplifier 8 equals (26 mV)×24=624 mV. The comparison result output DML of the comparator 53 is high. That is, the reference voltage (output voltage VKD) generated by the data which is the input data of the DAC 61 plus the correction of −16 mV is lower than the voltage to be compared which is 100 mV. As a result, it is confirmed that the error voltage is 16 mV or lower.

Step 45:

The DAC 61 correction value corresponding to (−1)×(−16 mV)×½=8 mV is set into the correction value input data storing means 64. (A value greater than the correction value in S44 by 24 mV is set.)

The effective output voltage VKD of the DAC 61 equals 98 mV because of the error of −10 mV in the VKD, while the output voltage ΔVK of the amplifier 8 equals (2 mV)×24=48 mV. The output DML corresponding to the comparator 53 is high. That is, the reference voltage (output voltage VKD) generated by the data which is the input data of the DAC 61 plus the correction of 8 mV is lower than the voltage to be compared which is 100 mV. As a result, it is confirmed that the error voltage is −8 mV or lower.

Step 46:

Since the output state of the output DML corresponding to the comparator 53 has not changed in S45, the changing direction of the correction is set to be the same as that of S45. That is, the changing direction is to increase the correction value. The amount to be increased is set to be half the amount increased in S45. That is, the addition data for the correction value is (24 mV)×½=12 mV. Thus, the DAC 61 correction value corresponding to 8 mV+12 mV=20 mV is set into the correction value input data storing means 64. (A value greater than the correction value in S45 by 12 mV is set.)

The effective output voltage VKD of the DAC 61 equals 110 mV, while the output voltage ΔVK of the amplifier 8 equals (−10 mV)×24=−240 mV. The output DML corresponding to the comparator 53 is low. That is, the reference voltage (output voltage VKD) generated by the data which is the input data of the DAC 61 plus the correction of 20 mV is lower than the voltage to be compared which is 100 mV. As a result, it is confirmed that the error voltage is −20 mV or higher.

Step 47:

Since the output state of the output DML corresponding to the comparator 53 has changed in S46, the changing direction of the correction is reversed relative to that of S46. That is, the changing direction is to search a correction value in the middle between the correction value of S45 and the correction value of S46, that is, to reduce the correction value. The amount to be reduced is set to be half the amount increased in S46. That is, the subtraction data for the correction value is (12 mV)×½=6 mV. Thus, the DAC 61 correction value corresponding to −6 mV+20 mV=14 mV is set into the correction value input data storing means 64.

The effective output voltage VKD of the DAC 61 equals 104 mV, while the output voltage ΔVK of the amplifier 8 equals (−4 mV)×24=−96 mV. The output DML corresponding to the comparator 53 is low. As a result, it is confirmed that the error voltage of the DAC 61 is −14 mV or higher.

Step 48:

Since the output state of the output DML corresponding to the comparator 53 has not changed in S47, the changing direction of the correction is set to be the same as that of S47. That is, the changing direction is to search a correction value in the middle between the correction value of S45 and the correction value of S47, that is, to reduce the correction value. The amount to be reduced is set to be half the amount reduced in S47. That is, the subtraction data for the correction value is (6 mV)×½=3 mV. Thus, the DAC 61 correction value corresponding to −3 mV+14 mV=11 mV is set into the correction value input data storing means 64.

The effective output voltage VKD of the DAC 61 equals 101 mV, while the output voltage ΔVK of the amplifier 8 equals (−1 mV)×24=−24 mV. The output DML corresponding to the comparator 53 is low. As a result, it is confirmed that the error voltage of the DAC 61 is −11 mV or higher.

Step 49:

Since the output state of the output DML corresponding to the comparator 53 has not changed in S48, the changing direction of the correction is set to be the same as that of S48. That is, the changing direction is to search a correction value in the middle between the correction value of S45 and the correction value of S48, that is, to reduce the correction value. The amount to be reduced is set to be half the amount reduced in S48. That is, the subtraction data for the correction value is (3 mV)×½=1.5 mV. Thus, the DAC 61 correction value corresponding to −1.5 mV+11 mV=9.5 mV is set into the correction value input data storing means 64.

The effective output voltage VKD of the DAC 61 equals 99.5 mV, while the output voltage ΔVK of the amplifier 8 equals (+0.5 mV)×24=12 mV. The output DML corresponding to the comparator 53 is high. As a result, it is confirmed that the error voltage of the DAC 61 is −9.5 mV or lower.

Step 50:

Since the output state of the output DML corresponding to the comparator 53 has changed in S49, the changing direction of the correction is reversed relative to that of S49. That is, the changing direction is to search a correction value in the middle between the correction value of S49 and the correction value of S48, that is, to increase the correction value. The amount to be increased is set to be half the amount reduced in S49. That is, the addition data for the correction value is (1.5 mV)×½=0.75 mV. Thus, the DAC 61 correction value corresponding to 0.75 mV+9.5 mV=10.25 mV is set into the correction value input data storing means 64.

The effective output voltage VKD of the DAC 61 equals 100.25 mV, while the output voltage ΔVK of the amplifier 8 equals (−0.25 mV)×24=−6 mV. The output DML corresponding to the comparator 53 is low. As a result, it is confirmed that the error voltage of the DAC 61 is −10.25 mV or higher.

Step 51:

Since the output state of the output DML corresponding to the comparator 53 has changed in S50, the changing direction of the correction is reversed relative to that of S50. That is, the changing direction is to search a correction value in the middle between the correction value of S50 and the correction value of S49, that is, to reduce the correction value. The amount to be reduced is set to be half the amount increased in S50. That is, the subtraction data for the correction value is (0.75 mV)×½=0.375 mV. Thus, the DAC 61 correction value corresponding to −0.375 mV+10.25 mV=9.875 mV is set into the correction value input data storing means 64.

The effective output voltage VKD of the DAC 61 equals 99.875 mV, while the output voltage ΔVK of the amplifier 8 equals (+0.125 mV)×24=3 mV. The output DML corresponding to the comparator 53 is high. As a result, it is confirmed that the error voltage of the DAC 61 is −9.875 mV or lower.

Step 52:

Since the output state of the output DML corresponding to the comparator 53 has changed in S51, the changing direction of the correction is reversed relative to that of S51. That is, the changing direction is to increase the correction value. The amount to be increased is set to be half the amount reduced in S51. That is, the addition data for the correction value is (0.375 mV) ×½=0.1875 mV. Thus, the DAC 61 correction value corresponding to +0.1875 mV+9.875 mV=10.0625 mV is set into the correction value input data storing means 64.

The effective output voltage VKD of the DAC 61 equals 100.0625 mV, while the output voltage ΔVK of the amplifier 8 equals (−0.0625 mV)×24=−1.5 mV. The output ML corresponding to the comparator 53 is low. As a result, it is confirmed that the error voltage of the DAC 61 is −10.0625 mV or higher.

Step 53:

Since the output state of the output DML corresponding to the comparator 53 has changed in S52, the changing direction of the correction is reversed relative to that of S52. The amount to be reduced is set to be half the amount increased in S52. That is, the addition data for the correction value is (0.1875 mV)×½=0.09375 mV. Thus, the DAC 61 correction value corresponding to −0.09375 mV+10.0625 mV=9.96875(9.9688) mV is set into the correction value input data storing means 64.

The effective output voltage VKD of the DAC 61 equals 99.9688 mV, while the output voltage ΔVK of the amplifier 8 equals (+0.0312 mV)×24=0.7488 mV. The output DML corresponding to the comparator 53 is high. As a result, it is confirmed that the error voltage of the DAC 61 is −9.9688 mV or lower.

Step 54:

Since the output state of the output DML corresponding to the comparator 53 has changed in S53, the changing direction of the correction is reversed relative to that of S53. The amount to be increased is set to be half the amount reduced in S53. That is, the addition data for the correction value is (0.09375 mV)×½=0.046875 mV. Thus, the DAC 61 correction value corresponding to 9.9688 mV+0.046875 mV=10.015675 mV is set into the correction value input data storing means 64.

The effective output voltage VKD of the DAC 61 equals 100.015675 mV, while the output voltage ΔVK of the amplifier 8 equals (−0.015675 mV)×24=−0.3762 mV. The output DML corresponding to the comparator 53 is low. As a result, it is confirmed that the error voltage of the DAC 61 is −10.015675 mV or higher. Since the amount to be changed for the correction value has become smaller than the resolution 50 μV of the DAC 61 to be corrected, further correction is not performed. The correction data 10.015675 mV at this time is adopted as the correction value. According to this correction, the error in the effective output voltage VKD of the DAC 61 equals 0.015675 mV.

Step 55:

Since the error voltage is −10.015675 mV or higher and −9.9688 mV or lower, the average 9.992237 mV of the correction values obtained in S53 and S54 may be adopted as the correction value. According to this correction, the error in the effective output voltage VKD of the DAC 61 equals −0.00777 mV. This is a further improved value in comparison with the error in the effective output voltage VKD of the DAC 61 obtained in S54.

[Embodiment 11]

Correction Method for Gain Error of Expected Voltage Generating Means 60

A gain error indicates an error in the output voltage which is caused by an error in the amplification factor (gain) which is defined as the ratio of the output voltage change to the input data change in the DAC 61. A gain error is corrected in the following correction procedure for an exemplary case that the gain error is 0.01% and that the offset error is 0 mV. The expression of the digital input data of the DAC 61 is the same as in Embodiment 10. FIG. 9 shows the block configuration of the expected voltage generating means 60 serving as the main part of a correction system for implementing this correction. As described above, an operation unit 67 for calculating a gain correction coefficient and correction value input data which serves as the input data to the DAC 61 is added to the configuration of FIG. 8. The system for this correction is similarly to that of Embodiment 10 for obtaining an offset error correction value.

The gain error correction is performed by a method in which a correction is applied at two points in the output voltage state of the DAC 61. In the present embodiment, error correction values are obtained in the case that 100 mV (0.1 V) and 12900 mV (12.9 V) are selected as the two points (FIGS. 13 and 14), whereby a gain error correction coefficient for correcting the gain error is obtained from the error correction value. Operations necessary in this procedure are merely the four operations. FIG. 13 is a status table showing the status in each step for obtaining an error correction value in the case that the output voltage of the DAC is 100 mV. An error correction value is obtained in Steps 61–72. FIG. 14 is a status table showing the status in each step for obtaining an error correction value in the case that the output voltage of the DAC is 12900 mV. An error correction value is obtained in Steps 81–92. The method used is the same as that of Embodiment 10, and hence the description is omitted.

Using the difference between the two pieces of final real input data (VKRD) and the difference between the two pieces of ideal value input data (VKID) of the DAC 61 obtained at the two points (output voltages 0.1 V and 12.9 V), a gain correction coefficient is obtained as follows. This gain correction coefficient indicates a coefficient for correcting the gain error so that the effective gain becomes unity.

$$\begin{aligned}\text{gain correction coefficient} = &\ ((\text{corrected real input data} \\ &\ \text{of DAC 61 at 12.9 V output}) - \\ &\ (\text{corrected real input data of} \\ &\ \text{DAC 61 at 0.1 V output})) \div \\ &\ ((\text{ideal value input data of} \\ &\ \text{DAC 61 for 12.9 V}) - \\ &\ (\text{ideal value input data of} \\ &\ \text{DAC 61 for 0.1 V})) = \\ &\ (12898.563 - 99.9375) / \\ &\ 128.00 = 99.989\,\% \end{aligned} \quad (1)$$

This indicates that a correction is necessary such that the gain is reduced by 0.011%. Thus, when data generated by multiplying the input data by 0.99989 is used as the real input data to the DAC 61, the gain error(0.01%) is corrected. That is, even in the case that the gain error is unknown in advance, the correction of the DAC 61 characteristics is performed at two points as described above, and then the difference between the two pieces of the correction data at the two points is divided by the difference between the two pieces of the ideal value input data of the DAC 61, whereby the value obtained is the correction gain for correcting the gain error. It should be noted that the two points for the correction are not limited to these two points at 12.900V and 0.100V.

The input data calculated by the above-mentioned method may directly be provided as the real input data to the DAC 61 from the outside. Alternatively, a correction value may be calculated according to Equation (1), and then the correction data may be inputted to the correction value input data storing means 64, whereby the correction may be performed. In this case, a value generated by subtracting −0.011% from the ideal value input data is used as the correction data. This data 0.011% is preferably stored in a non-volatile memory.

According to this method, the offset of the expected voltage generating means 60 which contributes as the offset voltage on the to-be-compared circuit side of the expected voltage generating means 60 can be absorbed into the correction value. In the present embodiment, the offset error has been assumed to be 0 mV. However, even in the case that the offset error is other than 0 mV, the two-point correction according to the present embodiment obviously permits the simultaneous correction of the gain error and the offset error. Further, even in the case that the amplifier 8, in addition to the expected voltage generating means 60, has an error, the procedure according to the present embodiment obviously permits the simultaneous correction of these two errors.

In the above-mentioned correction value setting procedure, the output of the second semiconductor testing apparatus 200 (semiconductor testing apparatus 200) has been fed back to the expected voltage generating means 60, whereby the controlling means 65 has controlled the correction value calculation on the basis of the fed-back data (see FIGS. 7 and 9). This permits the correction without using an expensive testing apparatus. Alternatively, the output of the tester controlling means 40 may be fed back to the expected voltage generating means 60, whereby the tester controlling means may control the correction value calculation on the basis of the fed-back data. In this case, the function of the controlling means 65, the storing means 66, and the operation means 67 is performed by the tester controlling means 40, the storing means (not shown), and the operation means (not shown) provided in the tester apparatus 15. Thus, the expected voltage generating means 60 does not need to comprise the controlling means 65, the storing means 66, and the operation means 67.

The precision voltage generating means 13 may be replaced by the voltage output of the tester apparatus 15. In this case, the correction precision is restricted by the resolution in the voltage output of the tester apparatus 15. However, a separate apparatus serving as the precision voltage generating means 13 is advantageously eliminated. Even in the case that a plurality types of DUTs are to be tested, for example, even in the case that 6 V specification devices and 13 V specification devices are to be tested, when the correction value setting is performed corresponding to the output amplitude of each DUT, the precision in the measured voltage is obviously optimized.

In the semiconductor testing apparatus (semiconductor test system) of FIGS. 4 and 5, when the precision in the comparators (52 and 53) provided in the first semiconductor testing apparatus 201 (a testing apparatus module is built inside the semiconductor testing apparatus 15) and the second semiconductor testing apparatus 200 (a testing apparatus module is provided outside the semiconductor testing apparatus 15) and the resolution of the DACs (61, 106, and 107) provided corresponding thereto are improved, the measurement error is obviously reduced further. In the configuration of FIG. 4 in which the second semiconductor testing apparatus 200 is provided outside the semiconductor tester (semiconductor testing apparatus 15), the precision of the comparators of only a part of the channels (and the resolution of the DACs 61 corresponding thereto) can easily be improved. This permits easy construction of an inexpensive testing apparatus corresponding to each device specification.

[Embodiment 12]

Figure 15:
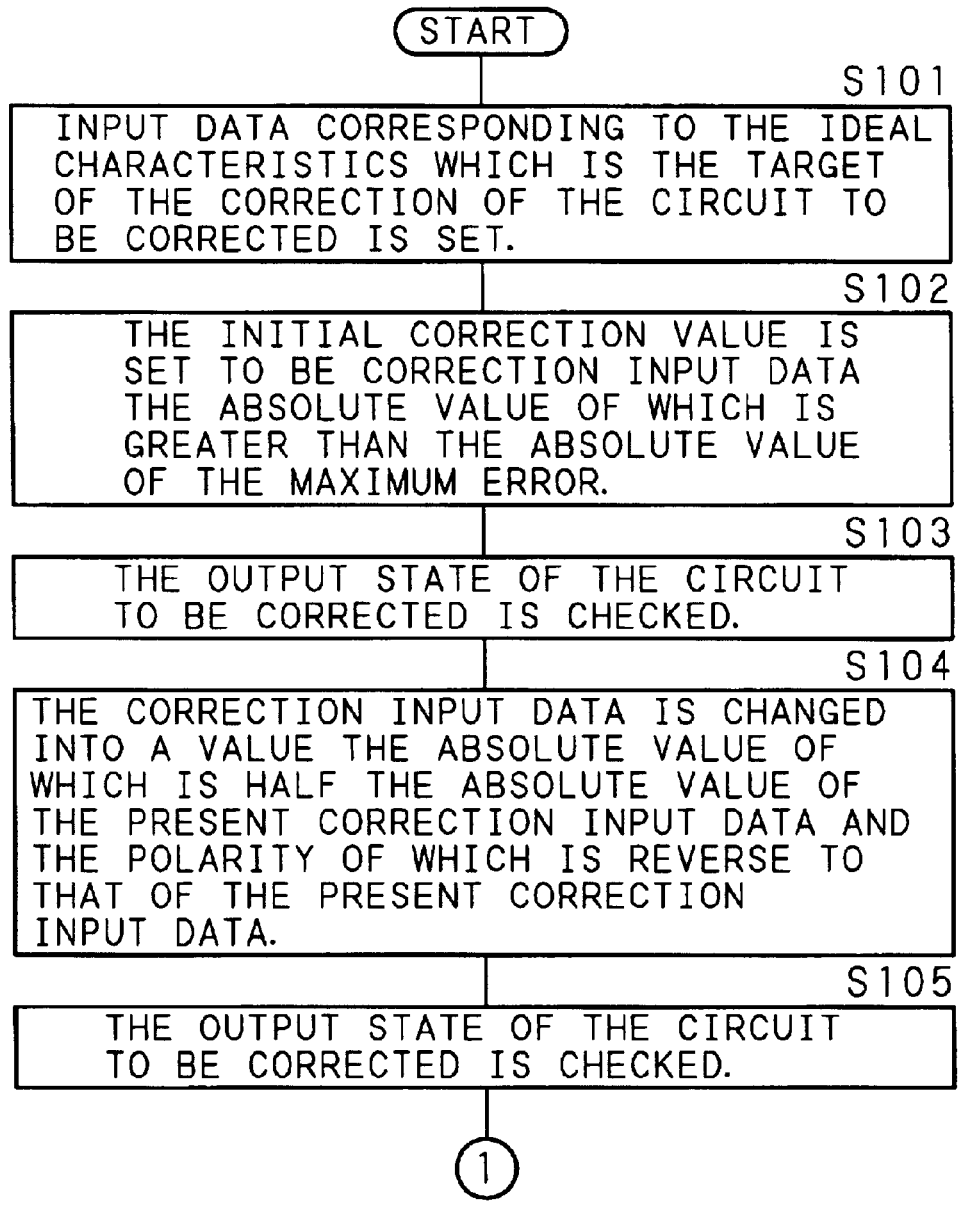
FIG. 15 is a flowchart showing a correction method for a circuit to be corrected according to the invention.
Figure 16A:
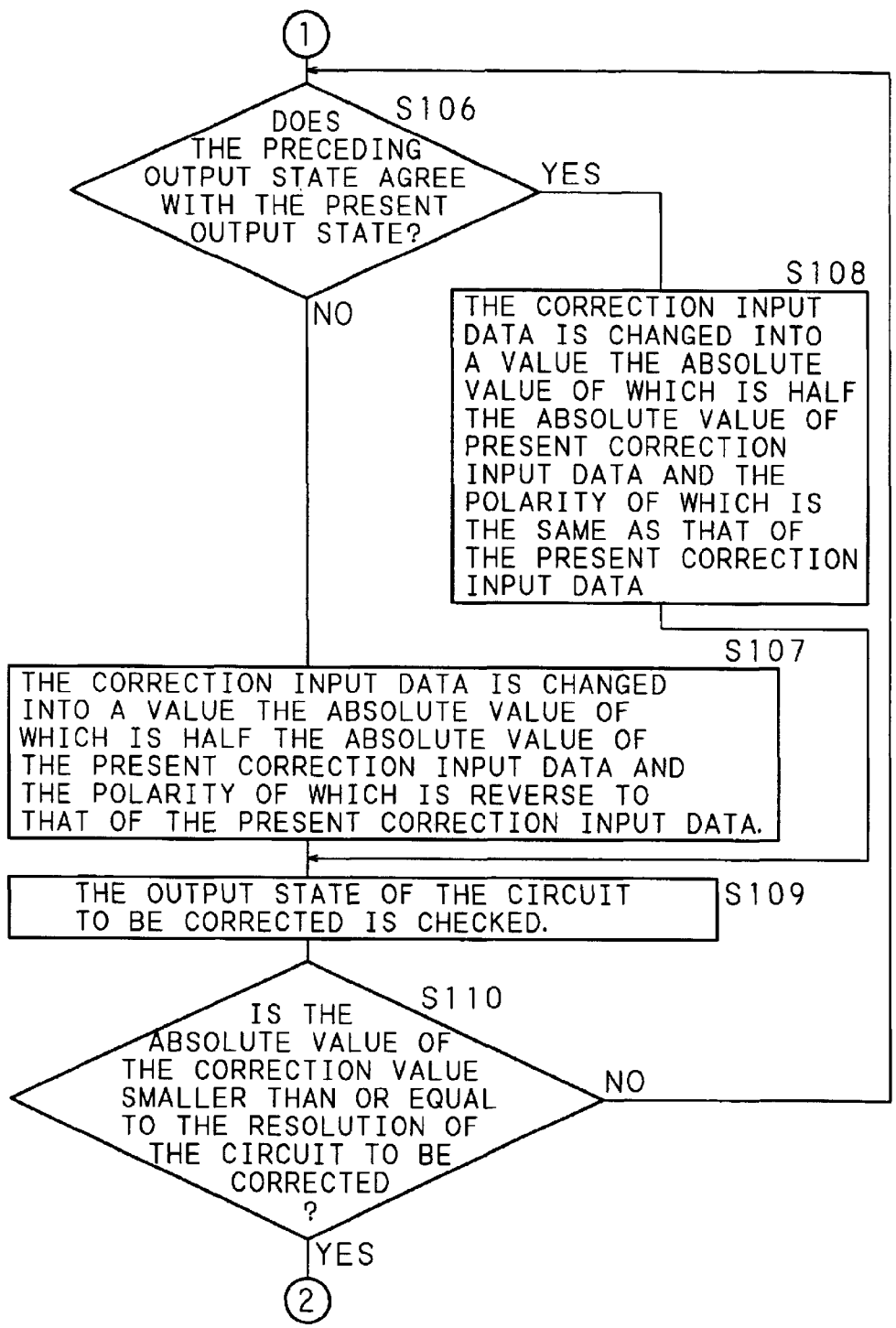
FIG. 16A is a flowchart showing a correction method for a circuit to be corrected according to the invention.
Figure 16B:
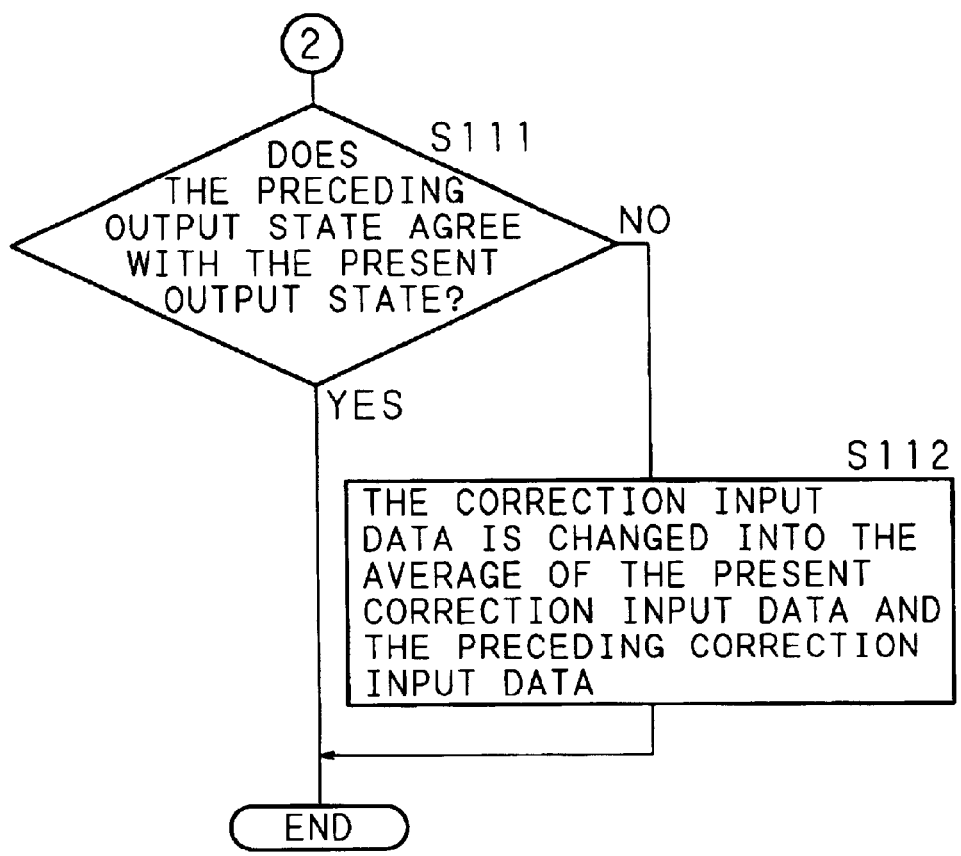
FIG. 16B is a flowchart showing a correction method for a circuit to be corrected according to the invention.
Figure 17:
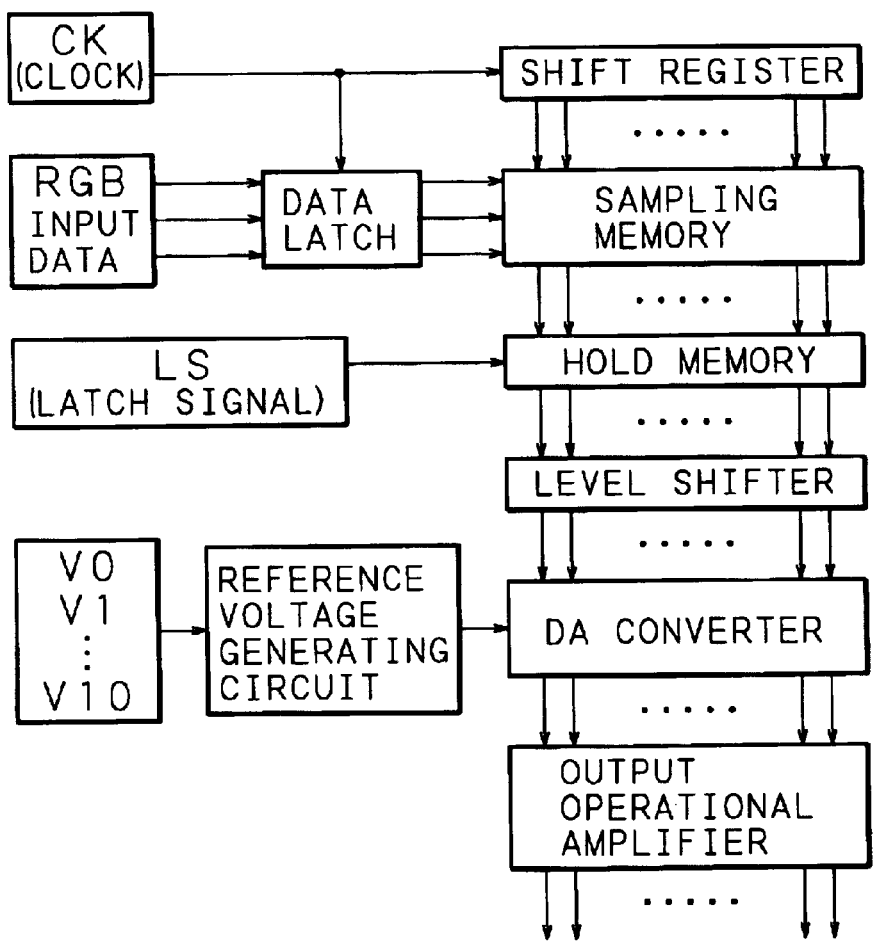
FIG. 17 is a block diagram schematically showing a typical liquid crystal driving apparatus.
Figure 18:
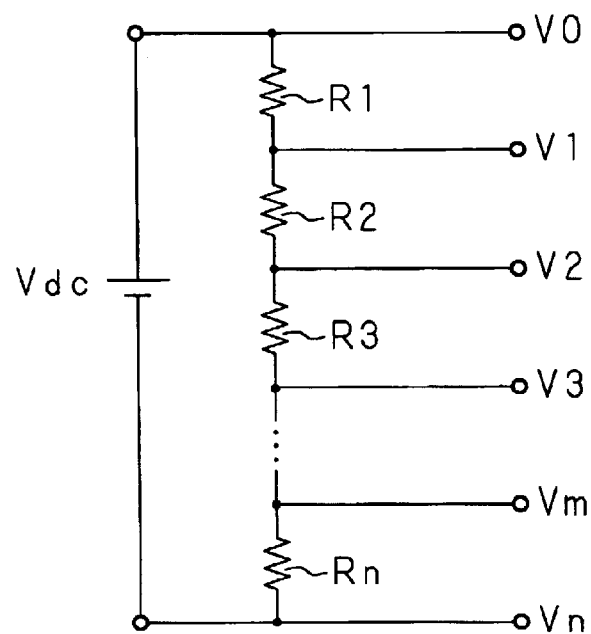
FIG. 18 is a circuit diagram schematically showing a reference voltage generation circuit.
Figure 19:
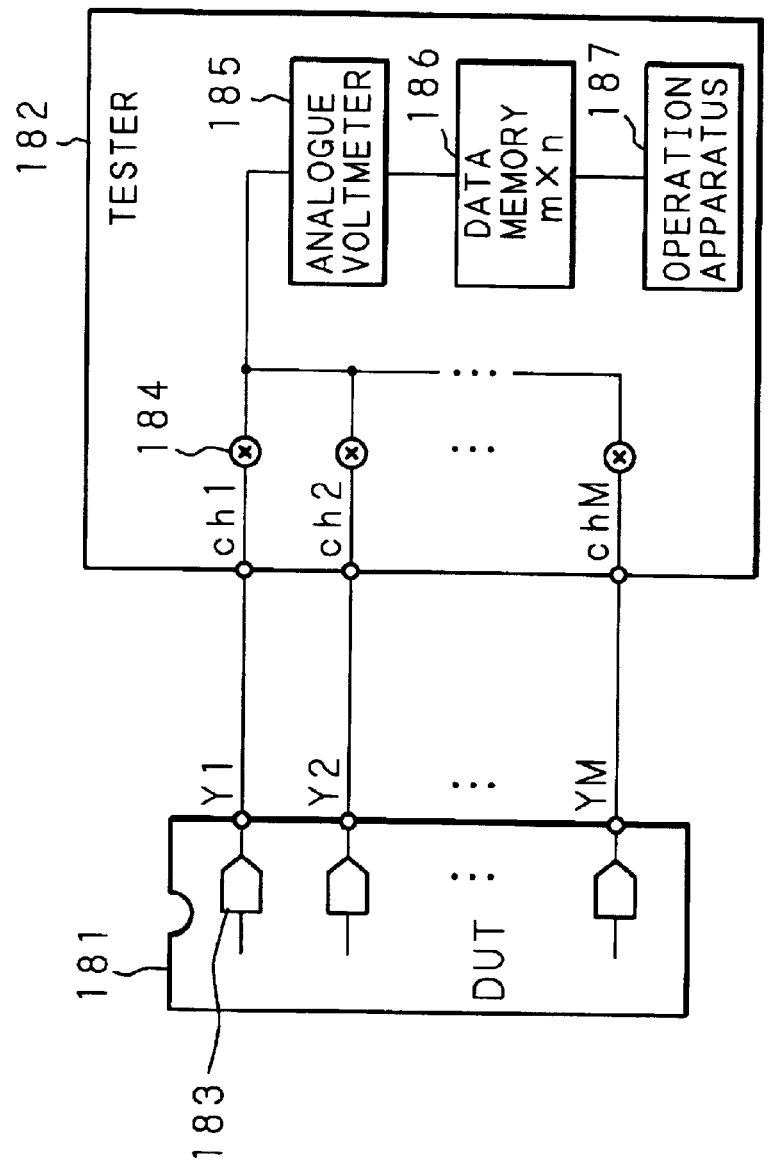
FIG. 19 is a block diagram schematically showing a prior art semiconductor test system.

FIGS. 15, 16A and 16B show a flowchart showing a correction method for a circuit to be corrected according to the invention. Embodiment 12 relates to a generic procedure of the correction methods of Embodiments 7–11, and is schematically shown in FIGS. 15, 16A and 16B.

A circuit to be corrected indicates specifically a comparator, a digital-to-analogue converter, a combination thereof, a combination with another circuit, or the like. An output state indicates a voltage value including its positive or negative polarity in the case that the output voltage is analogue, and indicates a logic high or low state in the case that the output voltage is a logic signal or the like. The other technical terms are basically to be understood according to the technical terms used in Embodiments 7–11. For example, a maximum error indicates a specification error, a maximum allowable error, or the like.

Step 101:

Input data corresponding to the ideal characteristics which is the target of the correction of the circuit to be corrected is set. For example, in Embodiment 8, this step corresponds to the inputting of VOH=0.000 V. As described above, it should be noted that the data 0.000 V is provided actually in the form of digital data, but that the data is expressed as an analogue value for the simplicity of understanding (this applies also to the following description).

Step 102:

The initial correction value is set to be correction input data the absolute value of which is greater than the absolute value of the maximum error. For example, in Embodiment 8, this step corresponds to the inputting of the initial correction data for VOH=+128 mV.

Step 103:

The output state of the circuit to be corrected is checked. The output state indicates, for example, a logic state. In this case, it is checked whether the logic state is either high or low. For example, in Embodiment 8, this step corresponds to that the output level in Step 1 is high.

Step 104:

The correction input data is changed into a value the absolute value of which is half the absolute value of the present correction input data and the polarity of which is reverse to that of the present correction input data. For example, in Embodiment 8, this step corresponds to Step 2 in which the present correction input data corresponds to the initial value of +128 mV, and in which the correction input data is changed into a value of −64 mV which is generated by reversing the sign of 64 mV obtained as the half of +128 mV.

Step 105:

The output state of the circuit to be corrected is checked. This step is similar to S103. For example, in Embodiment 8, this step corresponds to that the output level in Step 2 is low.

Step 106:

It is determined whether the preceding output state agrees with the present output state or not. The preceding output state indicates, for example, the high level in S103, while the present output state indicates, for example, the low level in S105. An example of embodiment 8 (the output in Step 1 is high, while the output in Step 2 is low) corresponds to the case of disagreement (NO). In this case, the procedure goes to Step 107 (S107). In the case of agreement (YES), the procedure goes to Step 108 (S108).

Step 107:

The correction input data is changed into a value the absolute value of which is half the absolute value of the present correction input data and the polarity of which is reverse to that of the present correction input data. Then, the procedure goes to Step 109. For example, in Embodiment 8, this step corresponds to Step 3 in which the present correction input data corresponds to −64 mV, and in which the correction input data is changed into a value of +32 mV which is generated by reversing the sign of −32 mV obtained as the half of −64 mV. In the following description, mention to the correspondence to Embodiment 8 is omitted.

Step 108:

The correction input data is changed into a value the absolute value of which is half the absolute value of the present correction input data and the polarity of which is the same as that of the present correction input data.

Step 109:

The output state of the circuit to be corrected is checked. This step is similar to S105.

Step 110:

It is determined whether the absolute value of the correction value (absolute value of the correction input data) is smaller than or equal to the resolution of the circuit to be corrected or not. When this relation is satisfied (YES), the procedure goes to Step 111. When this relation is not satisfied (NO), the procedure returns to Step 106, and then the subsequent steps are repeated.

Step 111:

It is determined whether the preceding output state agrees with the present output state or not. In the case of agreement, the correction procedure is terminated. In the case of disagreement, the procedure goes to Step 112.

Step 112:

The correction input data is changed into the average of the present correction input data and the preceding correction input data. Then, the correction procedure is terminated.

In the above-mentioned correction procedure, a limit may be placed on the number of correction operations, and the precision may be adjusted when necessary, whereby the time for correction may be shortened.

A program for implementing the above-mentioned correction method according to the invention may be recorded as a computer program in a recording medium, whereby a computer may execute the method. For example, the block sections disclosed as the storing means and the controlling means may be implemented in the form of a computer. The program recorded in the recording medium may be in a form that can be carried separately from a computer main body (testing apparatus or the like).

The above-mentioned description has been made for the case that the invention is applied to a testing apparatus for liquid crystal driving apparatuses for TFT liquid crystal display devices. However, the semiconductor testing apparatus and the semiconductor testing method according to the invention are obviously applicable to a testing apparatus for semiconductor integrated circuits having a large number of output terminals for outputting various multi-level voltages.

As described above, according to the invention, the acceptance-or-rejection determination and measurement test of semiconductor integrated circuits having a large number of output terminals for outputting multi-level voltages for driving liquid crystal display panels and the like is achieved without using any means such as precision comparators causing an increase in the cost. Further, when a semiconductor testing apparatus having a simple configuration is constructed in the form of a module and then provided outside a semiconductor test system, the prior art semiconductor test system can be used as it is. And still, the semiconductor test system has a simple configuration but a high precision.

As this invention may be embodied in several forms without departing from the spirit of essential characteristics thereof, the present embodiments are therefore illustrative and not restrictive, since the scope of the invention is defined by the appended claims rather than by the description preceding them, and all changes that fall within metes and bounds of the claims, or equivalence of such metes and bounds thereof are therefore intended to be embraced by the claims.

What is claimed is:

1. A semiconductor testing apparatus which tests the gradation output voltage characteristics of a semiconductor integrated circuit for outputting a gradation output voltage through each of a plurality of output terminals and which comprises plural pieces of output voltage testing means each corresponding to each of said output terminals, wherein said output voltage testing means comprises:

test voltage inputting means for inputting a voltage to be tested which is obtained from a gradation output voltage;

comparison voltage generating means for generating a comparison voltage to be compared with the voltage to be tested, on the basis of comparison voltage generation data provided from comparison voltage generation data inputting means; and comparing means for comparing the voltage to be tested with the comparison voltage; and wherein said comparison voltage generation data is generated by adding common comparison voltage generation data shared with the other pieces of output voltage testing means to individual comparison voltage generation data provided for each piece of output voltage testing means in order to correct an intrinsic error in each piece of comparing means.

2. A semiconductor testing apparatus according to claim 1, wherein:

the output voltage testing means is composed of an electronic circuit for testing the voltage to be tested;

the test voltage inputting means is composed of an electronic circuit for inputting the voltage to be tested; and the comparison voltage generation data inputting means is composed of an electronic circuit for inputting the comparison voltage generation data.

3. A semiconductor testing apparatus according to claim 1, wherein said comparison voltage generation data inputting means comprises:

common comparison voltage generation data inputting means for inputting the common comparison voltage generation data;

individual comparison voltage generation data inputting means for inputting the individual comparison voltage generation data; and an adder for adding the common comparison voltage generation data to the individual comparison voltage generation data; and wherein the result of the addition in said adder is provided as said comparison voltage generation data to the comparison voltage generating means.

4. A semiconductor testing apparatus according to claim 3, wherein:

the common comparison voltage generation data inputting means is composed of an electronic circuit for inputting the common comparison voltage generation data; and the individual comparison voltage generation data inputting means is composed of an electronic circuit for inputting the individual comparison voltage generation data.

5. A semiconductor testing apparatus according to claim 3, wherein said comparing means comprises:

a high level comparator for comparing and detecting whether the voltage to be tested is at or below an upper allowable limit relative to the comparison voltage or not; and a low level comparator for comparing and detecting whether the voltage to be tested is at or above a lower allowable limit relative to the comparison voltage or not; and wherein:

a high level comparison voltage generated by comparison voltage generation data inputting means and comparison voltage generating means corresponding to the high level comparator is provided to the high level comparator; and a low level comparison voltage generated by comparison voltage generation data inputting means and comparison voltage generating means corresponding to the low level comparator is provided to the low level comparator.

6. A semiconductor testing apparatus according to claim 5, further comprising an integrated circuit driving section for driving said semiconductor integrated circuit.

7. A semiconductor testing apparatus according to claim 6, wherein said semiconductor integrated circuit is composed of a semiconductor integrated circuit for liquid crystal driving.

8. A semiconductor testing apparatus according to claim 1, wherein said comparing means comprises:

a high level comparator for comparing and detecting whether the voltage to be tested is at or below an upper allowable limit relative to the comparison voltage or not; and a low level comparator for comparing and detecting whether the voltage to be tested is at or above a lower allowable limit relative to the comparison voltage or not; and wherein:

a high level comparison voltage generated by comparison voltage generation data inputting means and comparison voltage generating means corresponding to the high level comparator is provided to the high level comparator; and a low level comparison voltage generated by comparison voltage generation data inputting means and comparison voltage generating means corresponding to the low level comparator is provided to the low level comparator.

9. A semiconductor testing apparatus according to claim 8, further comprising correction data generating means for setting and storing said individual comparison voltage generation data and for outputting the individual comparison voltage generation data to the comparison voltage generation data inputting means.

10. A semiconductor testing apparatus according to claim 9, wherein the correction data generating means is composed of an electronic circuit for generating the individual comparison voltage generation data.

11. A semiconductor testing apparatus according to claim 1, further comprising correction data generating means for setting and storing said individual comparison voltage generation data and for outputting the individual comparison voltage generation data to the comparison voltage generation data inputting means.

12. A semiconductor testing apparatus according to claim 11, wherein said correction data generating means is provided for each piece of output voltage testing means.

13. A semiconductor testing apparatus according to claim 12, further comprising an integrated circuit driving section for driving said semiconductor integrated circuit.

14. A semiconductor testing apparatus according to claim 13, wherein said semiconductor integrated circuit is composed of a semiconductor integrated circuit for liquid crystal driving.

15. A semiconductor testing apparatus according to claim 1, further comprising:
- expected voltage generating means for outputting an expected gradation voltage corresponding to said gradation output voltage; and
- voltage difference detecting means for acquiring the difference between the gradation output voltage and the expected gradation voltage and then outputting the difference to the test voltage inputting means.

16. A semiconductor testing apparatus according to claim 15, wherein said expected voltage generating means is composed of an electronic circuit for generating the expected gradation voltage.

17. A semiconductor testing apparatus according to claim 15, wherein said expected voltage generating means comprises:
- ideal value input data storing means for storing ideal value input data for the expected gradation voltage;
- correction value input data storing means for storing correction value input data for correcting the expected gradation voltage;
- an adder for adding the ideal value input data to the correction value input data and then outputting the expected voltage data; and
- expected voltage outputting means for generating an expected gradation voltage based on the expected voltage data and then providing the expected gradation voltage to the voltage difference detecting means.

18. A semiconductor testing apparatus according to claim 17, wherein:
- said ideal value input data storing means is composed of an ideal value input data memory device; and
- said correction value input data storing means is composed of a correction value input data memory device.

19. A semiconductor testing apparatus according to claim 17, wherein said comparison voltage generating means comprises a digital-to-analogue converter, while said expected voltage outputting means comprises a digital-to-analogue converter, and wherein the digital-to-analogue converter provided in the expected voltage outputting means has a higher resolution than the digital-to-analogue converter provided in the comparison voltage generating means.

20. A semiconductor testing apparatus according to claim 19, further comprising an integrated circuit driving section for driving said semiconductor integrated circuit.

21. A semiconductor testing apparatus according to claim 20, wherein said semiconductor integrated circuit is composed of a semiconductor integrated circuit for liquid crystal driving.

22. A semiconductor testing apparatus according to claim 15, further comprising amplifying means for amplifying an output of said voltage difference detecting means and for providing the amplified output to the test voltage inputting means.

23. A semiconductor testing apparatus according to claim 22, wherein said voltage difference detecting means is composed of a subtractor, while said amplifying means is composed of an amplifier.

24. A semiconductor testing apparatus according to claim 22, further comprising a first correction switch a common terminal of which is connected to the test voltage inputting means, a first independent terminal of which is connected to the output terminal of the amplifying means, and a second independent terminal of which is connected to a fixed potential terminal, wherein
- said first correction switch connects the test voltage inputting means to the amplifying means when said gradation output voltage is to be tested, and connects the test voltage inputting means to the fixed potential terminal when the individual comparison voltage generation data is to be set and corrected in order to correct said comparison voltage.

25. A semiconductor testing apparatus according to claim 24, wherein said semiconductor testing apparatus is constructed as a module.

26. A semiconductor testing apparatus according to claim 25, further comprising an integrated circuit driving section for driving said semiconductor integrated circuit.

27. A semiconductor testing apparatus according to claim 26, wherein said semiconductor integrated circuit is composed of a semiconductor integrated circuit for liquid crystal driving.

28. A semiconductor testing apparatus according to claim 22, further comprising a second correction switch a common terminal of which is connected to the voltage difference detecting means, a first independent terminal of which is connected to the output terminal of the semiconductor integrated circuit, and a second independent terminal of which is connected to precision voltage generating means, wherein
- said second correction switch connects the voltage difference detecting means to the semiconductor integrated circuit when said gradation output voltage is to be tested, and connects the voltage difference detecting means to the precision voltage generating means when said expected voltage generating means is to be corrected.

29. A semiconductor testing apparatus according to claim 28, wherein said semiconductor testing apparatus is constructed as a module.

30. A semiconductor testing apparatus according to claim 29, further comprising an integrated circuit driving section for driving said semiconductor integrated circuit.

31. A semiconductor testing apparatus according to claim 30, wherein said semiconductor integrated circuit is composed of a semiconductor integrated circuit for liquid crystal driving.

32. A semiconductor testing method for testing the gradation output voltage characteristics of a semiconductor integrated circuit for outputting a gradation output voltage through each of a plurality of output terminals, comprising the steps of:
- providing a voltage to be tested which is based on the difference between said gradation output voltage and an expected gradation voltage corresponding to an ideal value for the gradation output voltage, into plural pieces of output voltage testing means each provided corresponding to each of said output terminals; and
- comparing a comparison voltage which is to be compared with said voltage to be tested, with said voltage to be tested and thereby testing the gradation output voltage by means of said output voltage testing means; wherein
- said comparison voltage is corrected in each piece of output voltage testing means in order to correct the intrinsic error of a digital-to-analogue converter provided in each piece of output voltage testing means.

33. A semiconductor testing method according to claim 32, wherein said expected gradation voltage is corrected in order to correct the intrinsic error of a digital-to-analogue converter provided in expected voltage generating means for generating an expected gradation voltage.

* * * * *